United States Patent
Kitamura et al.

(10) Patent No.: US 10,823,610 B2
(45) Date of Patent: Nov. 3, 2020

(54) LIGHT RECEIVING DEVICE, METHOD FOR FABRICATING LIGHT RECEIVING DEVICE

(71) Applicant: SUMITOMO ELECTRIC INDUSTRIES, LTD., Osaka (JP)

(72) Inventors: Takamitsu Kitamura, Osaka (JP); Hideki Yagi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 104 days.

(21) Appl. No.: 16/026,476

(22) Filed: Jul. 3, 2018

(65) Prior Publication Data

US 2019/0003884 A1 Jan. 3, 2019

(30) Foreign Application Priority Data

Jul. 3, 2017 (JP) .................. 2017-130637

(51) Int. Cl.
| | |
|---|---|
| *G02B 6/43* | (2006.01) |
| *H01L 31/105* | (2006.01) |
| *G01J 1/44* | (2006.01) |
| *G01J 1/42* | (2006.01) |
| *H01L 31/0232* | (2014.01) |
| *H01L 31/0304* | (2006.01) |

(Continued)

(52) U.S. Cl.
CPC .............. *G01J 1/44* (2013.01); *G01J 1/0209* (2013.01); *G01J 1/0407* (2013.01); *G01J 1/4228* (2013.01); *G02B 6/43* (2013.01); *H01L 31/02327* (2013.01); *H01L 31/03046* (2013.01); *H01L 31/035281* (2013.01); *H01L 31/105* (2013.01); *H01L 31/109* (2013.01); *H01L 31/1844* (2013.01); *G01J 2001/446* (2013.01); *G01J 2009/023* (2013.01); *G01J 2009/0261* (2013.01); *G02B 2006/12097* (2013.01); *G02B 2006/12147* (2013.01); *G02B 2006/12176* (2013.01); *G02B 2006/12178* (2013.01)

(58) Field of Classification Search
CPC ........................ G02B 6/4295; H01L 31/105
See application file for complete search history.

(56) References Cited

U.S. PATENT DOCUMENTS

2015/0260933 A1* 9/2015 Masuyama .......... G02B 6/4274
 385/14
2016/0285561 A1 9/2016 Wu et al.

* cited by examiner

*Primary Examiner* — Thanh Luu
(74) *Attorney, Agent, or Firm* — Smith, Gambrell & Russell, LLP.

(57) ABSTRACT

A method for fabricating a light receiving device includes: preparing a first substrate product which includes a semiconductor region having a common semiconductor layer, a first semiconductor laminate for a photodiode, a second semiconductor laminate for a waveguide, and a butt-joint between the first semiconductor laminate and the second semiconductor laminate, the first laminate and the second semiconductor laminate being disposed on the common semiconductor layer; etching the first substrate product with a first mask to form a second substrate product having a photodiode mesa structure produced from the first semiconductor laminate and a preliminary mesa structure produced from the second semiconductor laminate; etching the second substrate product with the first mask and a second mask, formed on the photodiode mesa structure; to produce a waveguide mesa structure from the preliminary mesa structure, and the waveguide mesa structure having a height larger than that of the preliminary mesa structure.

4 Claims, 17 Drawing Sheets

(51) Int. Cl.
  *H01L 31/109*   (2006.01)
  *H01L 31/18*    (2006.01)
  *H01L 31/0352*  (2006.01)
  *G01J 1/04*     (2006.01)
  *G01J 1/02*     (2006.01)
  *G01J 9/02*         (2006.01)
  *G02B 6/12*         (2006.01)

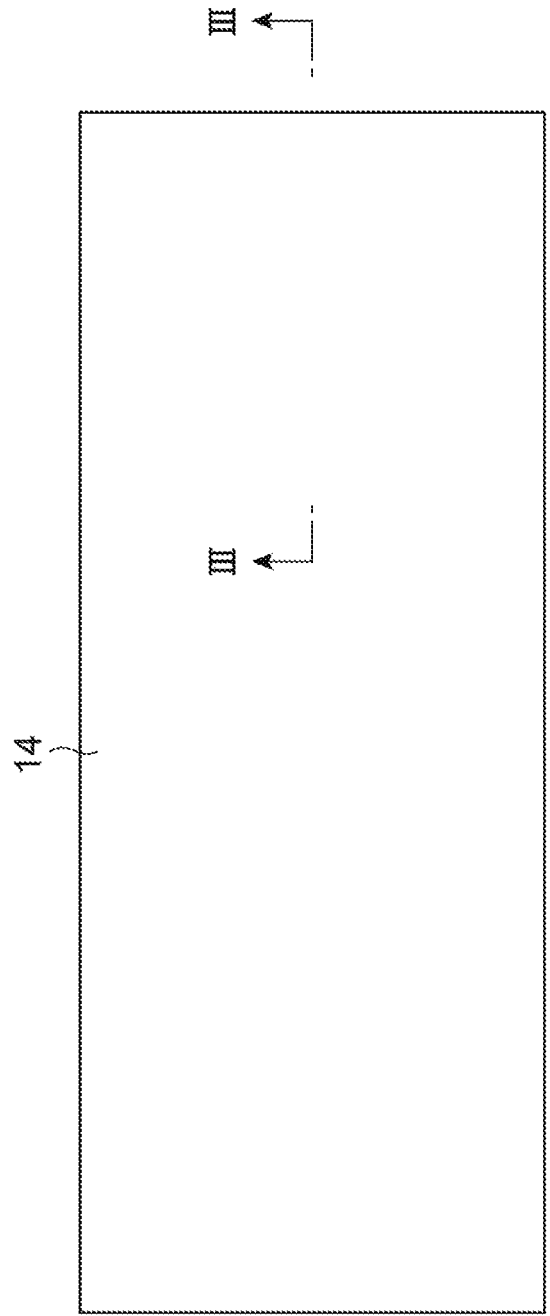
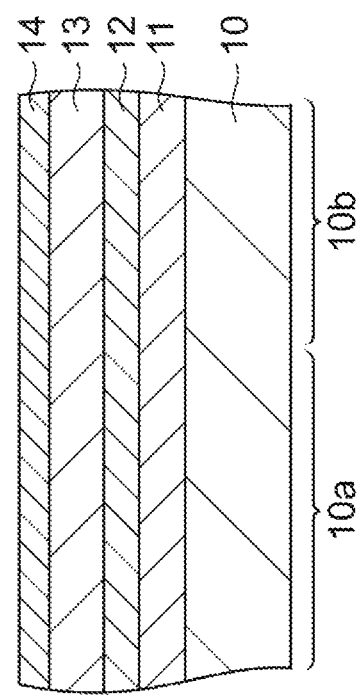

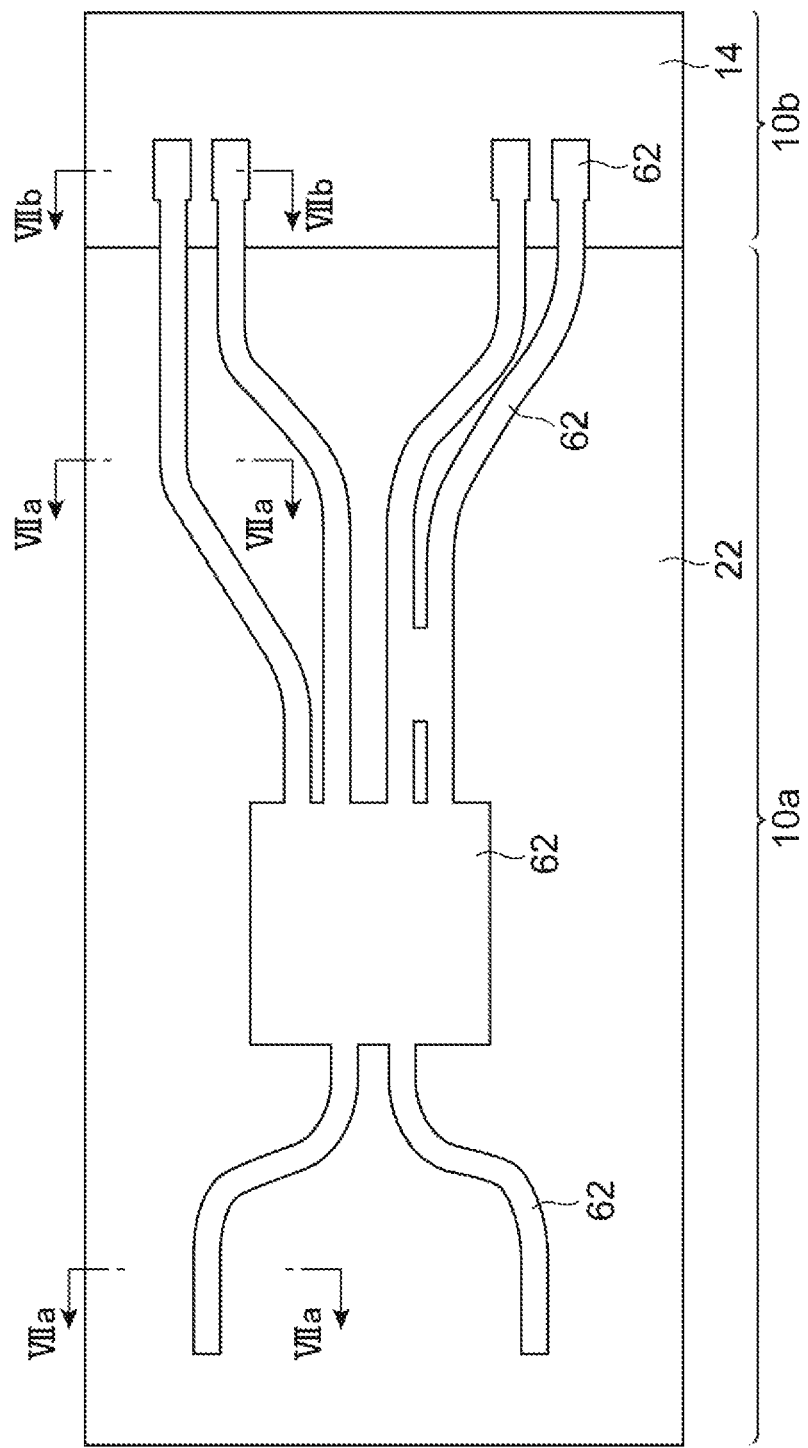

LIGHT RECEIVING DEVICE, METHOD FOR FABRICATING LIGHT RECEIVING DEVICE

BACKGROUND OF THE INVENTION

Field of the Invention

The present invention relates to a light receiving device and a method for fabricating a light receiving device. This application claims the benefit of priority from Japanese Patent Application No. 2017-130637 filed on Jul. 3, 2017, which is herein incorporated by reference in its entirety.

Related Background Art

US Patent Application Publication No. 2016/0285561 discloses a coherent receiver including a waveguide-type light receiving element.

SUMMARY OF THE INVENTION

A method for fabricating a light receiving device according to one aspect of the present embodiment includes: preparing a first substrate product including a semiconductor base and a semiconductor region on the semiconductor base, the semiconductor region having a common semiconductor layer, a first semiconductor laminate for a photodiode structure, a second semiconductor laminate for a waveguide structure, and a butt joint between the first semiconductor laminate and the second semiconductor laminate, and the first semiconductor laminate and the second semiconductor laminate being disposed on the common semiconductor layer; forming a first mask on the first substrate product, the first mask having a pattern on the first semiconductor laminate and the second semiconductor laminate, and the pattern of the first mask extending across the butt-joint; etching the first substrate product with the first mask and an etching gas to form a second substrate product, the second substrate product having a photodiode mesa structure produced from the first semiconductor laminate and a preliminary mesa structure produced from the second semiconductor laminate; forming a second mask on the second substrate product, the second mask having a pattern on the photodiode mesa structure and an opening on the preliminary mesa structure; and etching the second substrate product with the first mask and the second mask to produce a waveguide mesa structure from the preliminary mesa structure, and the waveguide mesa structure having a height larger than that of the preliminary mesa structure.

A light receiving device according to another aspect of an embodiment includes an optical waveguide section including a waveguide mesa structure; a first light receiving section optically coupled to the waveguide mesa structure; a second light receiving section optically coupled to the waveguide mesa structure; and a base including an isolation region having one of insulating and semi-insulating properties, the waveguide mesa structure, the first light receiving section, and the second light receiving section being disposed on the base. Each of the first light receiving section and the second light receiving section includes a photodiode mesa structure and an isolation mesa structure. The isolation mesa structure mounts the photodiode mesa structure. The waveguide mesa structure has a bottom in the isolation region, and the photodiode mesa structure has a bottom apart from the isolation region.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 3A is a plan view showing a major step in the method according to the embodiment.

FIG. 3B is a cross-sectional view taken along line III-III shown in FIG. 3A.

FIG. 6 is a plan view showing a major step in the method according to the embodiment.

DESCRIPTION OF THE EMBODIMENTS

Figure 1:
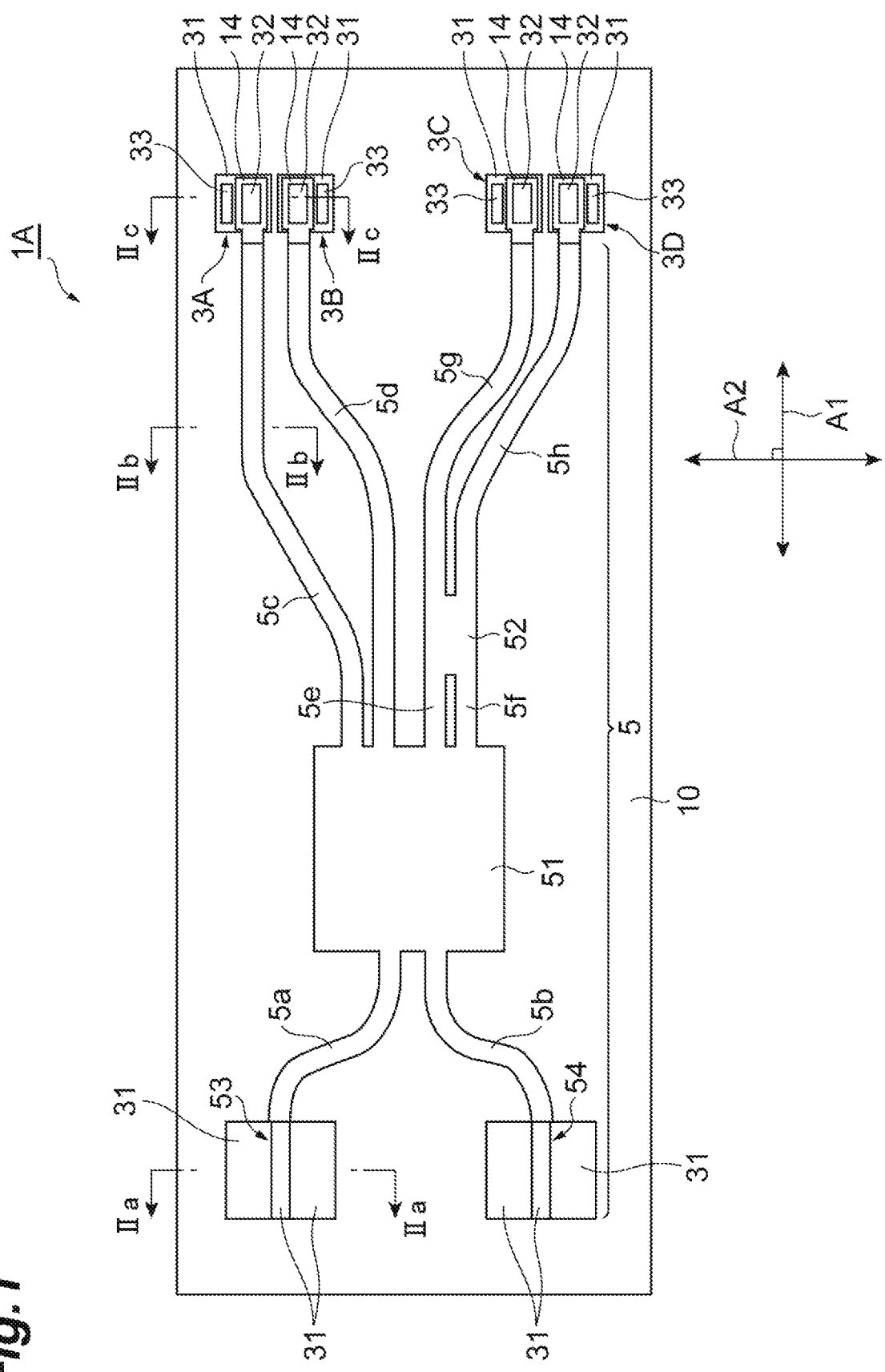
FIG. 1 is a plan view showing a light receiving device with a photodiode and a waveguide according to an embodiment of the present invention.

A waveguide-type light receiving device which monolithically integrates an optical waveguide and a light receiving element is being developed. The coherent optical receiver that is provided with the waveguide-type light receiving device extracts multiple signal components from an optical signal of phase shift keying modulation, and coverts the signal components into electrical signals by means of the waveguide-type light receiving device.

The waveguide-type light receiving device needs two kinds of semiconductor laminates butt joined to each other. One of the semiconductor laminates is prepared for a photodiode, and the other is prepared for a waveguide. The photodiode semiconductor laminate includes semiconductor films for an n-type (or p-type) lower semiconductor layer, a light absorbing layer and a p-type (or n-type) upper semiconductor layer, which are arranged on a substrate, and the waveguide semiconductor laminate includes semiconductor films for the common lower semiconductor layer, a core layer, and a cladding layer, which are arranged on the substrate. These semiconductor laminates are patterned by etching to form an optical waveguide mesa and a photodiode mesa butt joined to each other, which are on the common lower semiconductor layer It is an object of one aspect of the present invention to provide a method for fabricating a light receiving device and a light receiving device, which enable high electric isolation.

A description will be given of embodiments according to the present above aspects.

A method for fabricating a light receiving device according to an embodiment includes: (a) preparing a first substrate product including a semiconductor base and a semiconductor region on the semiconductor base, the semiconductor region having a common semiconductor layer, a first semiconductor laminate for a photodiode structure, a second semiconductor laminate for a waveguide structure, and a butt-joint between the first semiconductor laminate and the second semiconductor laminate, and the first semiconductor laminate and the second semiconductor laminate being disposed on the common semiconductor layer; (b) forming a first mask on the first substrate product, the first mask having a pattern on the first semiconductor laminate and the second semiconductor laminate, and the pattern of the first mask extending across the butt-joint; (c) etching the first substrate product with the first mask and an etching gas to form a second substrate product, the second substrate product having a photodiode mesa structure produced from the first semiconductor laminate and a preliminary mesa structure produced from the second semiconductor laminate; (d) forming a second mask on the second substrate product, the second mask having a pattern on the photodiode mesa structure and an opening on the preliminary mesa structure; and (e) etching the second substrate product with the first mask and the second mask to produce a waveguide mesa structure from the preliminary mesa structure, and the waveguide mesa structure having a height larger than that of the preliminary mesa structure.

In the method, the first etching forms the photodiode mesa structure and the preliminary mesa structure, which are mounted on the common conductive semiconductor layer, with the first mask, and then the second mask is formed to cover the photodiode mesa and a part of the first mask thereon. A second etching with these masks provides the preliminary mesa structure with additional side faces to form the waveguide mesa structure, so that the waveguide mesa structure provides the common conductive semiconductor layer thereof with a width smaller than that of the photodiode mesa structure. Because of the difference in the width of the common conductive semiconductor layer between the waveguide mesa structure and the photodiode mesa structure, the waveguide mesa structure can provide the photodiode mesa structure with a high isolation resistance and a low crosstalk.

In the method according to an embodiment, the first etching mask includes a material containing silicon; etching the first substrate product with the first mask and etching gas, includes depositing Si-based material on side faces of the photodiode mesa structure and the preliminary mesa structure; and etching the second substrate product with the first mask and the second mask includes depositing Si-based material on side faces of the waveguide mesa structure.

In the method according to an embodiment, the etching gas includes Si-based material; etching the first substrate product with the first mask and an etching gas includes depositing Si-based material on side faces of the photodiode mesa structure and the preliminary mesa structure; and etching the second substrate product with the first mask and the second mask includes depositing Si-based material on side faces of the waveguide mesa structure.

In the both processes, the Si-based compound deposited material can protect the side faces of the mesa structures.

In the method according to an embodiment, the first mask includes inorganic material and the second mask includes photosensitive material. These materials allow the second mask to be selectively removed with the first mask being left.

A light receiving device according to an embodiment includes (a) an optical waveguide section including a waveguide mesa structure; (b) a first light receiving section optically coupled to the waveguide mesa structure; (c) a second light receiving section optically coupled to the waveguide mesa structure; and (d) a base including an isolation region having one of insulating and semi-insulating properties, the waveguide mesa structure, the first light receiving section, and the second light receiving section being disposed on the base. Each of the first light receiving section and the second light receiving section includes a photodiode mesa structure and an isolation mesa structure. The isolation mesa structure mounts the photodiode mesa structure. The waveguide mesa structure has a bottom in the isolation region, and the photodiode mesa structure has a bottom apart from the isolation region. The waveguide mesa structure having a bottom in the isolation region can provide the photodiode mesa structure with a high isolation resistance and a low crosstalk.

In the light receiving device according to an embodiment, the photodiode mesa structure has a first conductivity-type semiconductor layer, an optical absorbing layer, and a second conductivity-type semiconductor layer. The waveguide mesa structure has a lower cladding region, a core region, and an upper cladding region, the lower cladding region includes the first conductivity-type semiconductor layer and a part of the isolation region. The photodiode mesa structure and the waveguide mesa structure are provided with the common first conductivity-type semiconductor layer.

The teachings of the present invention can be readily understood by considering the following detailed description with reference to the accompanying drawings shown as examples. Referring to the accompanying drawings, embodiments according to a light receiving device and a method for fabricating a light receiving device will be illustrated below. When possible, the same portions will be denoted by the same reference numerals.

Figure 2A:
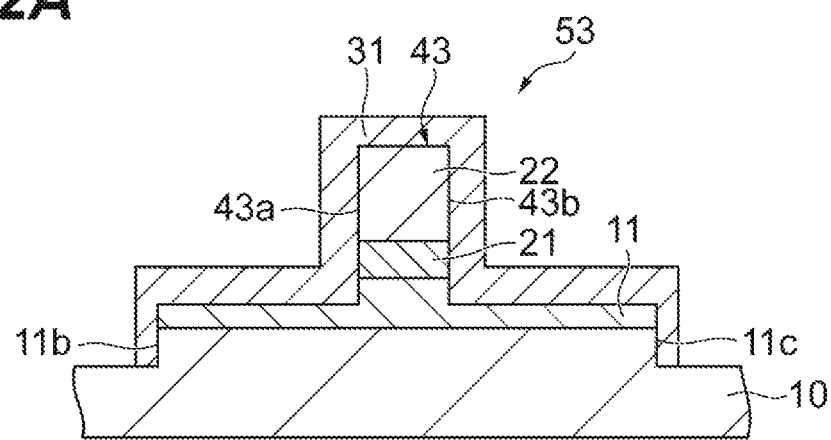
FIG. 2A is a cross-sectional view, taken along line IIa-IIa shown in FIG. 1, showing the light-receiving device according to an embodiment.
Figure 2B:
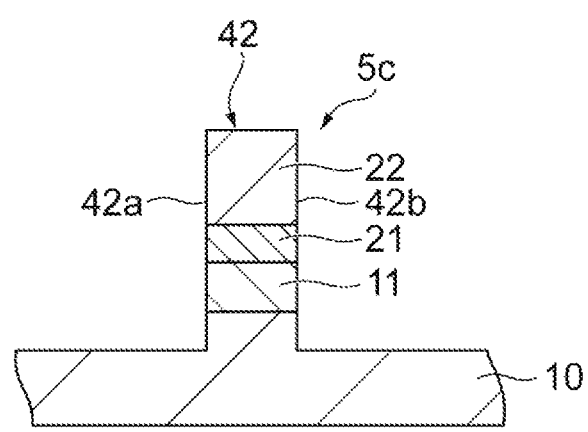
FIG. 2B is a cross-sectional view, taken along line IIb-IIb shown in FIG. 1, showing the light-receiving device.
Figure 2C:
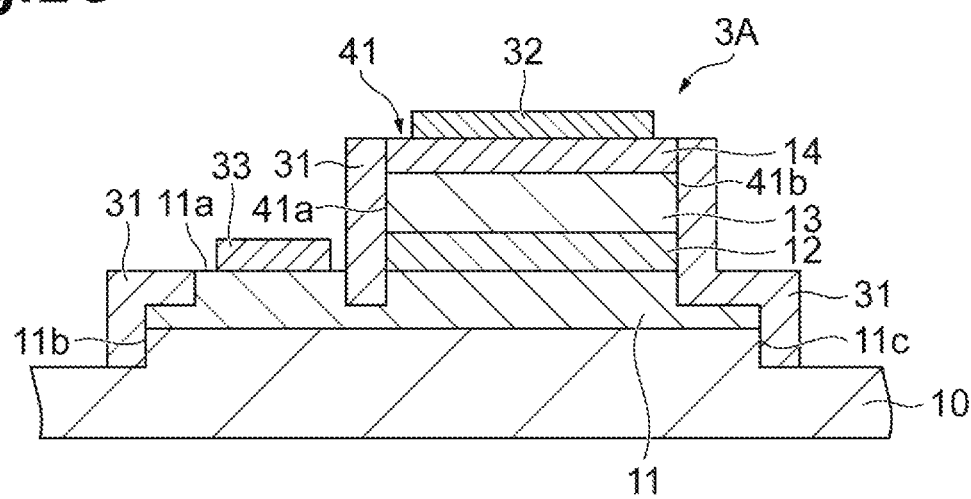
FIG. 2C is a cross-sectional view, taken along line IIc-IIc shown in FIG. 1, showing the light-receiving device.

FIG. 1 is a plan view showing a light receiving device with one or more light receiving elements and a waveguide connected thereto, that is, a waveguide-type light receiving device 1A, according to an embodiment. FIGS. 2A, 2B and 2C are cross-sectional views, each showing the waveguide-type light receiving device, taken along lines IIa-IIa, IIb-IIb, and IIc-IIc shown in FIG. 1, respectively. As shown in these figures, the waveguide-type light receiving device 1A of the present embodiment has an optical waveguide section 5, and multiple light receiving elements (specifically, four light receiving sections 3A to 3D in the embodiment) on an isolation semiconductor region having one of semi-insulating and insulating properties, specifically, a substrate 10. The substrate 10 may extend in a first direction A1. The optical waveguide section 5 is optically coupled to the light receiving sections (3A to 3D).

The substrate 10 has a surface made of material enabling epitaxial growth of III-V compound semiconductor either directly thereon or on a buffer layer, which is grown thereon. The substrate 10 can include a semi-insulating or insulating base, and for example, a III-V compound semiconductor doped with Fe. The substrate 10 may be mode of, for example, an InP base.

The light receiving sections (3A to 3D) and the optical waveguide section 5 are arranged on the substrate 10 in the first direction A1. Specifically, the light receiving sections 3A to 3D are arranged along one edge of the substrate 10 in a second direction A2 intersecting the first direction A1.

A description will be given of the light receiving sections 3A to 3D. FIG. 2C shows the cross section of the light receiving section 3A, and the other light receiving sections 3B to 3D also each have a device structure the cross section of which is the same as that in shown in FIG. 2C. The light receiving sections 3A to 3D each have a patterned first semiconductor layer 11, a light absorbing layer 12, a second semiconductor layer 13, and a contact layer 14 on the substrate 10. The patterned first semiconductor layer 11 forms an isolation mesa structure. The isolation mesa structure form an interface with the substrate 10, and the interface reaches the side faces 10c and 10d.

The first semiconductor layer 11 has a first conductivity-type, such as n-type. The first semiconductor layer 11 is made of a III-V compound semiconductor, such as n-type InP, and has a thickness of, for example, 1.5 to 3.0 micrometers, and a dopant concentration of, for example, $5 \times 10^{16}$ to $7 \times 10^{18}$ cm$^{-3}$. The first semiconductor layer 11 is formed as follows: a semiconductor film for the first semiconductor layer 11 is epitaxially grown on the substrate 10.

The light absorbing layer 12 is disposed on the first semiconductor layer 11 and is made of undoped semiconductor, which is produced from a semiconductor film epitaxially grown on the semiconductor film for the first semiconductor layer 11, having an impurity concentration of, for example, $1 \times 10^{13}$ cm$^{-3}$ or less. The light absorbing layer 12 is made of a III-V compound semiconductor, such as GaInAs, having a bandgap smaller than that of the first semiconductor layer 11. The light absorbing layer 12 has a thickness of, for example, 200 to 500 nm, and specifically, 400 nm in the embodiment. The light absorbing layer 12 receives light, which propagates through the optical waveguide section 5, specifically, a core layer 21 thereof, and produces photo carriers from the light thus received.

The second semiconductor layer 13 is disposed on the light absorbing layer 12 and is made of a III-V compound semiconductor of a second conductivity-type, such as p-type InP, which is produced from a semiconductor film for the second semiconductor layer 13 epitaxially grown on the semiconductor film for the light absorbing layer 12. The second semiconductor layer 13 has a bandgap larger than that of the light absorbing layer 12. The second semiconductor layer 13 has a thickness of, for example, 0.5 to 1.0 micrometers, and has a dopant concentration of, for example, $5 \times 10^{16}$ to $1 \times 10^{19}$ cm$^{-3}$.

The contact layer 14 is disposed on the second semiconductor layer 13 and is made of a heavily-doped III-V compound semiconductor of the second conductivity-type, such as p-type GaInAs, which is produced from a semiconductor film for the contact layer 14 epitaxially grown on the second semiconductor layer 13. The second semiconductor layer 13 has a thickness of, for example, 100 to 500 nm, and has a dopant concentration of, for example, $7 \times 10^{17}$ cm$^{-3}$ to $9 \times 10^{19}$ cm$^{-3}$.

The light receiving sections 3A to 3D each has a first mesa structure 41 (a photodiode mesa structure), which extends in the direction A1. The mesa structure 41 in each of the light receiving sections 3A to 3D includes the light absorbing layer 12, the second semiconductor layer 13, and the contact layer 14. The isolation mesa structure of the patterned first semiconductor layer 11 mounts the photodiode mesa structure. In the light receiving sections 3A to 3D, the first semiconductor layer 11 has an upper part and a lower part, which is arranged in a third direction intersecting the first and second directions A1 and A2, on the substrate 10. The mesa structure 41 has a bottom in the first semiconductor layer 11, so that the mesa structure 41 further includes the upper part of the first semiconductor layer 11 and the mesa structure 41 is disposed on the lower part of the first semiconductor layer 11. The mesa structure 41 has first and second side faces 41a and 41b. These side faces 41a and 41b extend in a direction from the contact layer 14 to the substrate 10 to end in the first semiconductor layer 11, and the bottom of the mesa structure 41 is apart from the substrate 10. The distance between the principal surface of the substrate 10 and the lower edge of each of the side faces 41a and 41b, e.g., the thickness of the lower part of the first semiconductor layer 11 outside the mesa structure 41, is, for example, 0.5 to 1.0 micrometers. The light absorbing layer 12, the second semiconductor layer 13, and the contact layer 14 have respective side faces, which are arranged along a reference plane, in each of the side faces 41a and 41b. The side face of the light absorbing layer 12 is substantially aligned with the side faces of the second semiconductor layer 13 and the contact layer 14 in a direction normal to the principal surface of the substrate 10, and is substantially aligned with the side face of the upper part of the first semiconductor layer 11. The lower part of the first semiconductor layer 11 has a contact region 11a in each of the light receiving sections 3A to 3D, and a basal region, which is just under the mesa structure 41 and mounts the mesa structure 41. The contact region 11a is a side extension adjoining the basal region along the principal surface of the substrate 10 and protruding therefrom at the bottom of the mesa structure 41. The mesa structure 41 is formed by photolithography and dry etching as described below.

The light receiving sections 3A to 3D each have a first electrode 33 on the contact region 11a of the first semiconductor layer 11. The contact region 11a makes ohmic contact with the first electrode 33 (for example, a cathode electrode). The first semiconductor layer 11 provides the lower part with a first conductivity to allow the side extension of the first semiconductor layer 11 to enable electrical contact. The first electrode 33 is made of, for example, AuGeNi/Au. The light receiving sections 3A to 3D each has a second electrode 32 on the contact layer 14 of the mesa structure 41. The second electrode 32 makes ohmic contact with the contact layer 14. The second electrode 32 is made of, for example, Ti/Pt/Au.

The first semiconductor layer 11 has side faces 11b and 11c, which extend along the direction A1 and are apart from the bottom of the mesa structure 41. The side faces 11b and 11c each have a lower edge in contact with the substrate 10. The side faces 11b and 11c reaching the substrate 10 enable isolation among the light receiving sections 3A to 3D and provide each of the light receiving sections 3A to 3D with the island-like lower part of the first semiconductor layer 11 which mounts the mesa structure 41, thereby separating any one of the first semiconductor layers 11 in the light receiving sections 3A to 3D from the other. As described later, the side faces 11b and 11c of the lower part for each of the light receiving sections 3A to 3D are formed in an etching step which is different from that for forming the mesa structure 41 and produces trenches, having bottoms in the semi-insulating or insulating substrate 10, from the film for first semiconductor layer 11.

The light receiving sections 3A to 3D each include a semi-insulating semiconductor layer 31, which covers the mesa structure 41, the lower part of the first semiconductor layer 11, and the substrate 10, specifically, the side faces, such as faces 41a and 41b, of the mesa structure 41; the top and side faces, such as faces 11b and 11c, of the lower part of the first semiconductor layer 11; and the side faces of the substrate 10. The semi-insulating semiconductor layer 31 is made of a III-V compound semiconductor doped with a transition metal, such as, Fe. The semiconductor film 31 is selectively grown with a mask on the side faces of the mesa structure 41 and on the top and side faces of the first semiconductor layer 11.

With reference to FIG. 1 again, in the light receiving device 1A, the light receiving sections 3A to 3D are optically connected to respective waveguide mesas in the optical waveguide section 5 on the substrate 10. These waveguide mesas extend along the direction A1 in the vicinity of the light receiving sections 3A to 3D to reach these sections. Specifically, the optical waveguide section 5 includes first to eighth optical waveguides 5a to 5h, two spot size converters (SSCs) 53 and 54, a multimode interferometer including one or more MMI couplers, such as a 2×4 MMI coupler 51, and a 2×2 MMI coupler 52. In the present embodiment, as shown in FIG. 1, the light receiving sections 3A to 3D form respective butt joints with the optical waveguides 5c, 5d, 5g and 5h.

A description will be given of the optical waveguide section 5. FIG. 2B shows the cross-section of the structure of the third optical waveguide 5c, and the other optical waveguides 5a, 5b, and 5d to 5h each have the same cross-sectional structure as that of the third optical waveguide 5c. Each of the optical waveguides 5a to 5h includes a core layer 21, and a cladding layer 22 in addition to their first semiconductor layer 11, and further includes an upper portion of the substrate. The optical waveguides 5a to 5h are provided with the first semiconductor layer 11 common to the light receiving sections 3A to 3D, and accordingly the light receiving sections 3A to 3D and the optical waveguide section 5 are provided with the common thickness and constituent material of the first semiconductor layer 11. In the optical waveguide section 5, the core layer 21 is disposed on the first semiconductor layer 11 and can be made of a group III-V compound semiconductor, such as GaInAsP, having a larger refractive index than that of the first semiconductor layer 11. The core layer 21 has a thickness of, for example, 300 to 600 nm, and may have about the same thickness as that of the light absorbing layer 12 of the light receiving sections 3A to 3D in the embodiment. The core layer 21 has a bandgap wavelength of, for example, 1300 nm. The cladding layer 22 is disposed on the core layer 21, and can be made of a group III-V compound semiconductor, such as InP, having a smaller refractive index than that of the core layer 21. The cladding layer 22 has a thickness of, for example, 1.0 to 2.0 micrometers, and may have about the same as the sum of the second semiconductor layer 13 and the contact layer 14 in the light receiving sections 3A to 3D in the embodiment. The core layer 21 and the cladding layer 22 are made undoped, and have an impurity concentration of, for example, $1 \times 10^{13}$ cm$^{-3}$ or less.

In the waveguide section 5, the first semiconductor layer 11, the core layer 21, and the cladding layer 22 form a waveguide mesa structure 42 for the optical waveguides 5a to 5h, each of which has side faces 42a and 42b and includes the upper portion of the substrate 10. The photodiode mesa structure 41 and the waveguide mesa structure 42 have respective top semiconductor faces, which are substantially flat and extend along a reference plane. Regarding the third optical waveguide 5c, the fourth optical waveguide 5d, the seventh optical waveguide 5g, and the eighth optical waveguide 5h, the side faces 42a and 42b have respective lower edges in the substrate 10, so that the mesa structure 42 is provided with the upper portion of the substrate 10 and the side faces 42a and 42b include the side faces of the upper portion of the substrate 10. Accordingly, the side faces 42a and 42b extend from the cladding layer 22 to the substrate 10 along a reference plane intersecting a principal surface of the substrate 10. Specifically, the upper portion of the substrate 10, the entire first semiconductor layer 11, the core layer 21, and the cladding layer 22 in the mesa structure 42 have respective side faces, which are arranged along the reference plane.

The mesa structure 42 is formed by multiple dry etching processes as described later. The mesa structure 42 is provided with the side faces 42a and 42b, which has the respective side faces of the upper portion of the substrate 10, the entire first semiconductor layer 11, the core layer 21, and the cladding layer 22. The dry etching processes may provide the side faces 42a and 42b with very small unevenness around boundaries between adjoining semiconductor layers of different materials, for example, between the side face of the first semiconductor layer 11 and the side face of the core layer 21. The side faces 42a and 42b, however, extends from the cladding layer 22 to the substrate 10 along the reference plane.

As shown in FIG. 1, the MMI coupler 51 is optically coupled to the spot size converter 53 through the first optical waveguide 5a at one input port thereof. Specifically, the first optical waveguide 5a has one end connected to the spot size converter 53, and another end connected to the input port of the MMI coupler 51.

The MMI coupler 51 is optically coupled to the spot size converter 54 through the first optical waveguide 5b at another input port thereof. Specifically, the second optical waveguide 5b has one end connected to the spot size converter 54, and another end connected to the other input port of the MMI coupler 51. The interval between the two input ports of the MMI coupler 51 is narrower than the spacing between the spot size converters 53 and 54, so that the interval between the first and second optical waveguides 5a and 5b gradually decreases in the direction from the spot size converters 53 and 54 to the MMI coupler 51 from the value of the interval between the spot size converters 53 and 54.

The MMI coupler 51 is optically coupled to the light receiving section 3A through the third optical waveguide 5c at the first output port thereof. Specifically, the third optical waveguide 5c has one end connected to the first output port of the MMI coupler 51 and another end connected to the light receiving section 3A. The core layer 21 of the third optical waveguide 5c has an end face that forms a butt-joint with the end face of the light absorbing layer 12 of the light receiving section 3A.

The MMI coupler 51 is optically coupled to the light receiving section 3B through the fourth optical waveguide 5d at the second output port thereof. Specifically, the fourth optical waveguide 5d has one end connected to the second output port of the MMI coupler 51 and another end connected to the light receiving section 3B. The core layer 21 of the fourth optical waveguide 5d has an end face that forms a butt-joint with the end face of the light absorbing layer 12 of the light receiving section 3B.

The MMI coupler 51 is optically coupled to the fifth optical waveguide 5e at the third output port, and the MMI coupler 52 is optically coupled to the fifth optical waveguide 5e at one input port thereof. Specifically, the fifth optical waveguide 5e has one end connected to the third output end of the MMI coupler 51, and another end connected to the one input port of the MMI coupler 52.

The MMI coupler 51 is optically coupled to the sixth optical waveguide 5f at the fourth output port thereof, and the MMI coupler 52 is optically coupled to the sixth optical waveguide 5f at the other input port thereof. Specifically, the sixth optical waveguide 5f has one end connected to the fourth output end of the MMI coupler 51, and another end connected to the other input end of the MMI coupler 52.

The MMI coupler 52 is optically coupled to the light receiving section 3C through the seventh optical waveguide 5g at one output port thereof. Specifically, the seventh optical waveguide 5g has one end connected to the one output port of the MMI coupler 52, and another end connected to the light receiving section 3C. The core layer 21 of the seventh optical waveguide 5g has an end face that forms a butt-joint with the end face of the light absorbing layer 12 of the light receiving section 3C.

The MMI coupler 52 is optically coupled to the light receiving section 3D through the eighth optical waveguide 5h at the other output end thereof. Specifically, the eighth optical waveguide 5h has one end connected to the other output port of the MMI coupler 52, and another end connected to the light receiving section 3D. The core layer 21 of the eighth optical waveguide 5h has an end face that forms a butt-joint with the end face of the light absorbing layer 12 of the light receiving section 3D.

Referring to FIG. 1, the spot size converters 53 and 54 are disposed near the other end of the substrate 10 opposite to the one end thereof in the direction A1, and are arranged along the direction A2. In order to make optical coupling between the light receiving device 1A and an external optical device excellent, the spot size converters 53 and 54 each are provided with the core layer that has a first width at one end thereof and a second width at the other end thereof larger than the first width, and can be coupled with the external device at the other end.

As shown in FIG. 2A, the spot size converters 53 and 54 is provided with the upper part of the first semiconductor layer 11, the core layer 21, and the cladding layer 22, which are arranged on the substrate 10 to form a laminate. This laminate has the same structure as structures of the first to eighth optical waveguides 5a to 5h, so that the spot size converters 53 and 54 have the same constituent materials and thicknesses as those of the first to eighth optical waveguides 5a to 5h. The cladding layer 22, the core layer 21, and the upper part of the first semiconductor layer 11 form a mesa structure 43 (a SSC mesa structure) for the spot size converters 53 and 54. As will be described later, the mesa structure 43 is formed by dry etching and is provided with the side faces 43a and 43b thereby. The SSC mesa structure 43 and the waveguide masa structure 42 have respective top semiconductor faces, which can be substantially flat and extend along a reference plane.

In the spot size converters 53 and 54, the first semiconductor layer 11 is provided with the lower part which has a width larger than that of the light absorbing layer 12, and has the side faces 11b and 11c. The spot size converters 53 and 54 are provided with the semi-insulating semiconductor layer 31, which the light receiving sections 3A to 3D each have, so as to cover the mesa structure 43 and the first semiconductor layer 11. As in the light receiving sections 3A to 3D, the semiconductor film 31 is made of, for example, the Fe-doped III-V group compound semiconductor.

In the present embodiment, the light receiving device 1A may be used in, for example, a coherent light receiver. The optical receiving device 1A receives an optical signal including four signal components, modulated by Quadrature Phase Shift Keying (QPSK), through the spot size converter 53 from an external device, and a reference optical signal including a local oscillation component through the spot size converter 54. These optical signals are applied to the light receiving device 1A, such as a 90° optical hybrid which includes the MMI couplers 51 and 52, in the coherent light receiver, and the MMI couplers 51 and 52 enable multimode optical interference. The 90° optical hybrid allows the MMI couplers 51 and 52 to produce modulated four signal components from the applied optical signals. These four signal components are supplied to the light receiving sections 3A to 3D, respectively. The two of the four signal components have the same polarization of an in-phase, and the other two signal components have the same polarization, which is different from that of the former signal components. In addition, the four signal components have a quadrature relationship. The light receiving sections 3A to 3D receive respective bias voltages at their cathode electrodes. The light receiving sections 3A to 3D receive the four signal components via the optical waveguides 5c, 5d, 5g and 5h, respectively, to generate respective electric signals (photocurrent) in response to the light intensities of the four signal components.

Subsequently, a description will be given of a method for fabricating a waveguide-type light receiving device 1A according to the present embodiment with reference to FIGS. 3A to 15C, which are schematic views showing major processes in the method for fabricating the waveguide-type light receiving device 1A.

FIG. 3A is a plan view and FIG. 3B is a cross-sectional view taken along line III-III shown in FIG. 3A. As shown in FIGS. 3A and 3B, semiconductor films for the first semiconductor layer 11, the light absorbing layer 12, the second semiconductor layer 13, and the contact layer 14 are epitaxially grown in order to form an epi-wafer having a first semiconductor laminate on a semiconductor wafer. The semiconductor wafer is provided with an array of device sections each of which is prepared for the waveguide-type light receiving device 1A and has the first and second regions 10a and 10b. In this step, the first semiconductor laminate that includes the films for the layers 11 to 14 are grown by, for example, metal organic chemical vapor deposition (OMVPE), and these films for the layers 11 to 14 may be made of InP-based semiconductors. As seen from the above description, the first and second regions 10a and 10b are prepared for the optical waveguide section 5 and the light receiving sections 3A to 3D, respectively.

Figure 4A:
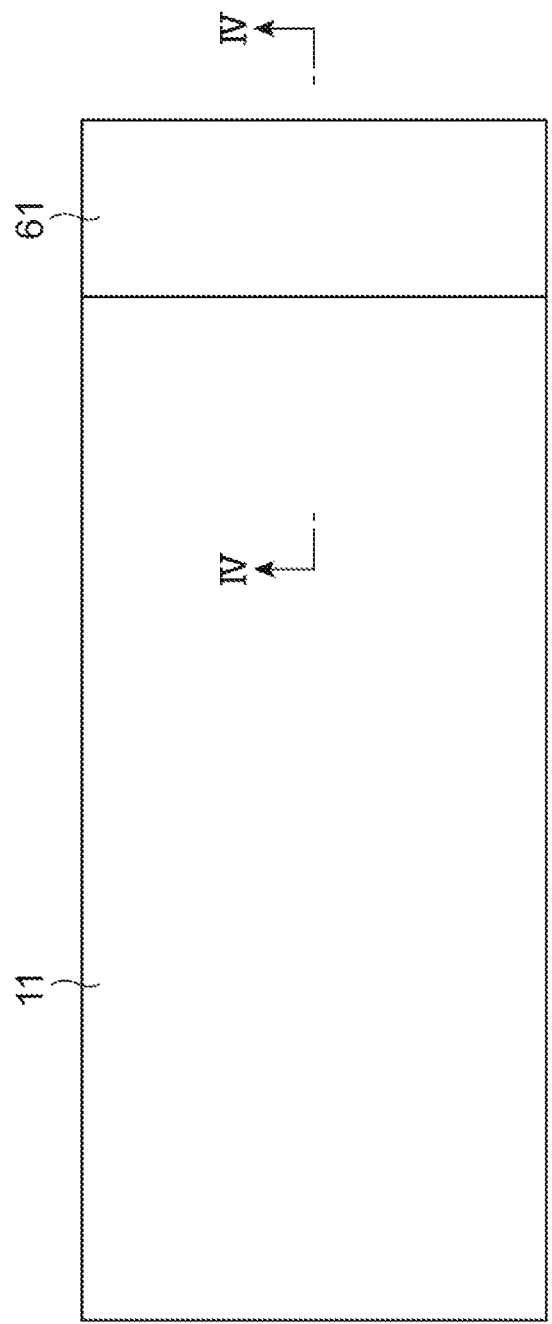
FIG. 4A is a plan view showing a major step in the method according to the embodiment.
Figure 4B:
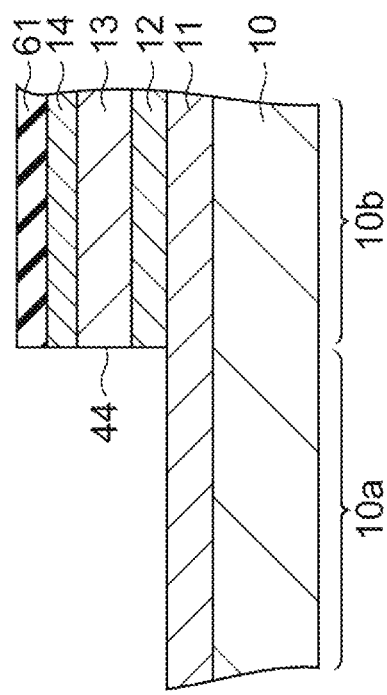
FIG. 4B is a cross-sectional view taken along line IV-IV shown in FIG. 4A.

FIG. 4A is a plan view and FIG. 4B is a cross-sectional view taken along IV-IV line shown in FIG. 4A. An etching mask 61 is formed on the first laminate, which is provided with the semiconductor films for a photodiode, having the contact layer 14, the light absorbing layer 12, the second semiconductor layer 13, and the first semiconductor layer 11. The etching mask 61 has an opening on the first region 10a for the optical waveguide section 5, and a pattern on the second region 10b for the light receiving sections 3A to 3D. The etching mask 61 is made of inorganic insulating material, for example, SiN, and has a thickness of, for example, 200 nm. The etching mask 61 is formed as follows: a SiN film is formed on the top of the first semiconductor laminate, i.e., the contact layer 14 by a vapor deposition (for example, CVD); a resist mask is formed on the SiN film by photolithography; and the SiN film is wet-etched using an etchant, such as BHF, with the resist mask to form a patterned SiN film, i.e., the etching mask 61. The patterned SiN film covers a part of the first laminate, and is located on the second region 10b of the wafer.

Subsequently, the first laminate is etched with the etching mask 61 to form an epi-product. Specifically, the films for the contact layer 14, the second semiconductor layer 13, and the light absorbing layer 12 are removed by etching with the etching mask 61 to form a strip-shaped laminate having an end face 44 for a butt-joint. This etching can be, for example, wet etching. Layers made of InP-based semiconductors can be wet-etched with, for example, an HCl-based or HBr-based etchant. The difference in etching rate between the films of the light absorbing layer 12 and the first semiconductor layer 11 allows the etching with the appropriate etchant to stop substantially, so that the first semiconductor layer 11 appears at the opening of the etching mask 61, i.e., on the first region 10a of the wafer. After the etching, the etching mask 61 still remains.

Figure 5A:
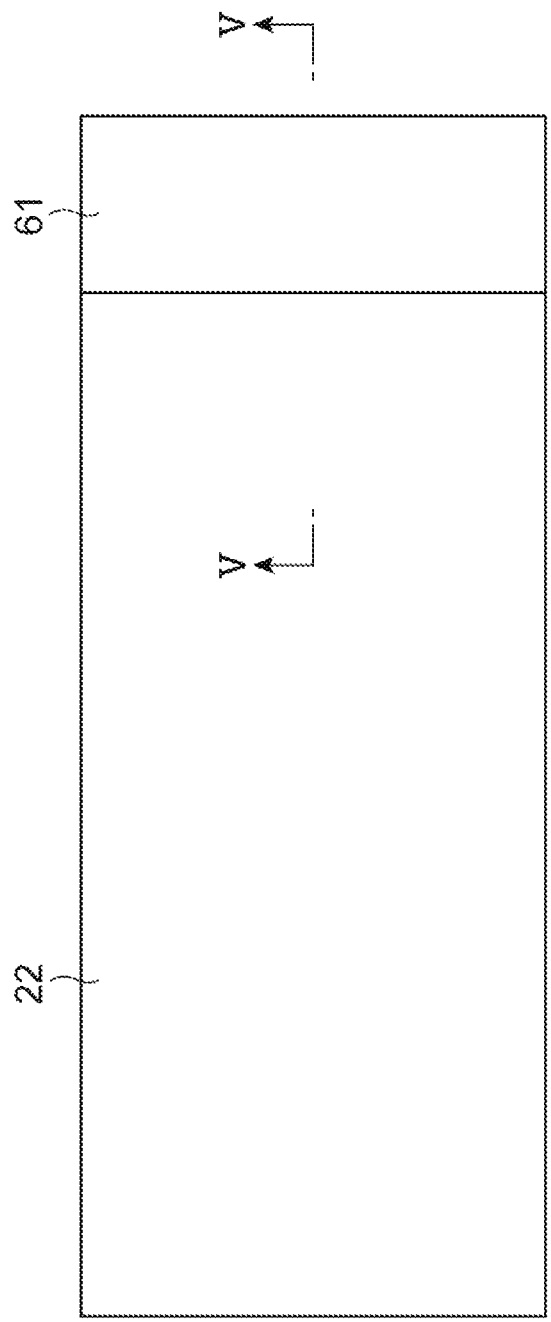
FIG. 5A is a plan view showing a major step in the method according to the embodiment.
Figure 5B:
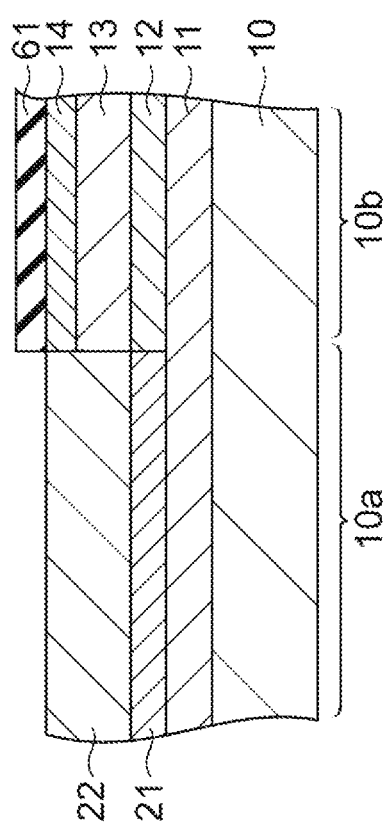
FIG. 5B is a cross-sectional view taken along line IV-IV shown in FIG. 4A.

FIG. 5A is a plan view and FIG. 5B is a cross-sectional view taken along the line V-V shown in FIG. 5A. Subsequently, as shown in FIGS. 5A and 5B, selective growth of semiconductor on the epi-product is conducted with the etching mask 61 to form a second laminate on the first region 10a of the wafer. Specifically, semiconductor films for the core layer 21 and the cladding layer 22 for the optical waveguide section 5 are epitaxially grown in order on the first semiconductor layer 11 (in a regrowth step) with the etching mask 61 left on the epi-product. The selective regrowth uses, for example, OMVPE. These processes bring a first substrate product to completion, and the first substrate product has a butt-joint between the first and second laminates specifically, between the core and cladding layers 21 and 22 and the contact and light absorbing layers 14 and 13.

Figure 7A:
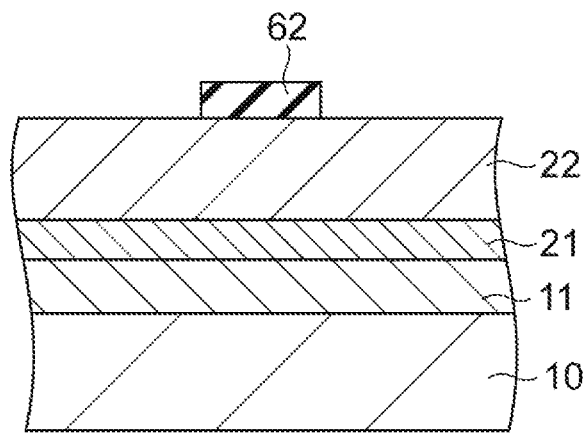
FIG. 7A is a cross-sectional view taken along line VIIa-VIIa shown in FIG. 6.
Figure 7B:
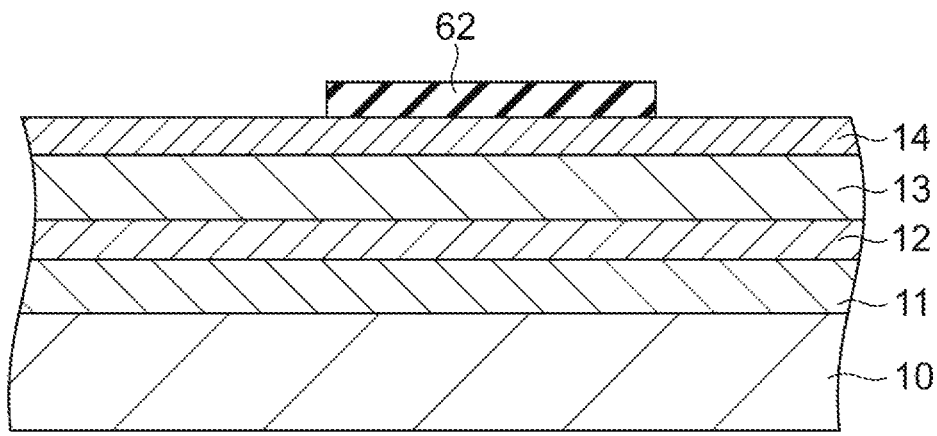
FIG. 7B is a cross-sectional view taken along line VIIb-VIIb shown in FIG. 6.

FIG. 6 is a plan view, and FIGS. 7A and 7B are sectional views, taken along lines VIIa-VIIa and VIIb-VIIb shown in FIG. 6. Subsequently, as shown in FIG. 6 and FIGS. 7A and 7B, a photodiode mesa structure 41, a preliminary mesa structure 42, and a spot size converter mesa structure 43 (shown in FIG. 2C) are formed (these are simply referred to as mesa structures 41, 42 and 43). Specifically, another etching mask 62 is formed on the first substrate product, which contains the butt-joint (in the step for forming the first etching mask). The etching mask 62 has a pattern which extends from the first region 10a to the second region 10b. The etching mask 62 is made of, inorganic material, such as Si-based inorganic material (for example, SiN, in the embodiment). Specifically, a SiN film is formed by CVD on the surface of the first substrate product, which contains the substrate 10 in the embodiment. The SiN film has a thickness of, for example, 300 nm. Then, a resist mask is formed by photolithography, and has a pattern, which defines the top shape of the mesa structures 41 to 43, extending across the butt-joint. The SiN film is etched by reactive ion etching (RIE) with the resist mask and etchant of $CF_4$ to form a patterned SiN mask, thereby obtaining the etching mask 62. The etching mask 62 has a pattern which defines the top shape of the mesa structures 41 to 43.

Figure 8A:
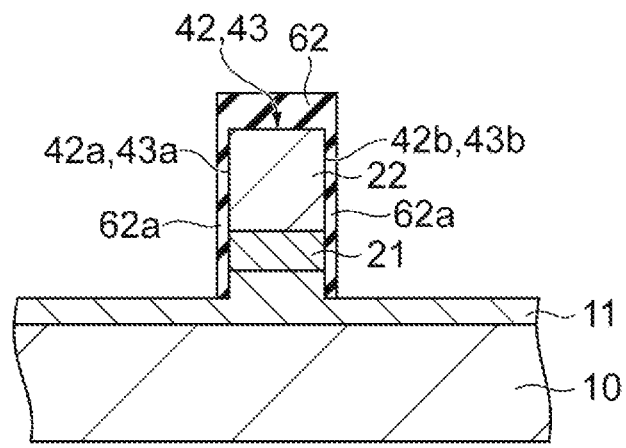
FIG. 8A is a cross-sectional view showing a major step in the method according to the embodiment.
Figure 8B:
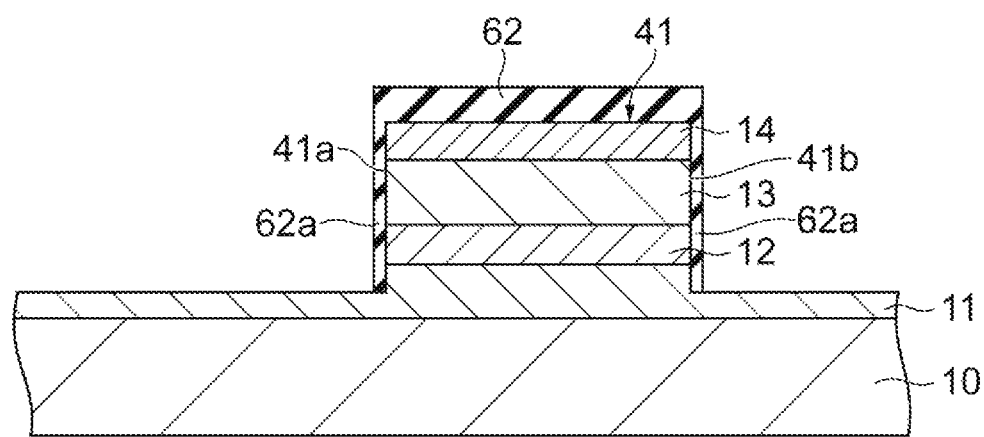
FIG. 8B is a cross-sectional view showing a major step in the method according to the embodiment.

FIGS. 8A and 8B are cross-sectional views showing the progresses of the major process of FIGS. 7A and 7B. Subsequently, as shown in FIGS. 8A and 8B, the first substrate product is etched with the etching mask 62 to form a second substrate product. This etching with the etching mask 62 uses a dry etching, which provides mesa structure 41, 42 and 43 with respective bottoms in the first semiconductor layer 11. The mesa structure 41 includes the second semiconductor layer 13 and the light absorbing layer 12 for the light receiving sections 3A to 3D (FIG. 8B), and further includes an upper part of the first semiconductor layer 11. The mesa structures 42 and 43 each include the cladding layer 22 and the core layer 21 (as shown in FIG. 8A) in the optical waveguide portion 5, and each further include an upper part of the first semiconductor layer 11. This dry etching is stopped in the middle of the first semiconductor layer 11 to leave a lower part of the first semiconductor layer 11 on the entire wafer 10.

Figure 9:
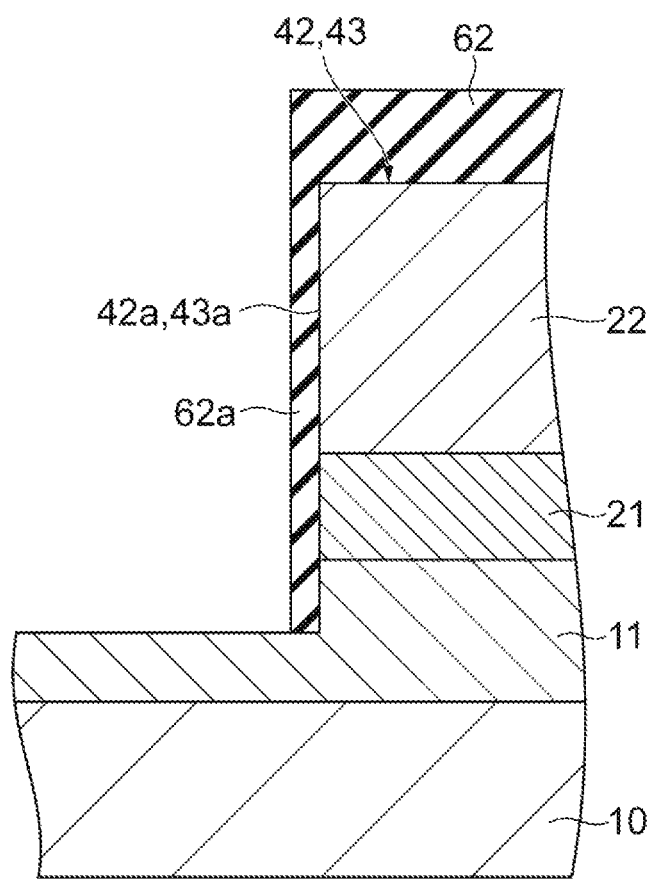
FIG. 9 is an enlarged sectional view showing Si-based compound deposited material.

During the dry etching, Si-based compound material 62a is deposited on the side faces 41a and 41b of the mesa structure 41, the side faces 42a and 42b of the preliminary mesa structure 42, and the side faces 43a and 43b of the mesa structure 43. FIG. 9 is an enlarged schematic cross sectional view showing the Si-based compound deposited material 62a. Specifically, the Si-based compound deposited material 62a is made of a compound containing, for example, Si and O. In the etching process with the etching mask 62 that contains Si as a constitute element, the dry etching process shaves the etching mask to produce Si compounds and particles and Si ions and atoms in the process chamber, and these Si-related substance in the process chamber are deposited on each side face to provide the Si-based compound deposition 62a. Alternatively, in the etching process with etching gas that contains Si as a constitute element, the dry etching process decomposes the etching gas to produce Si compounds, and Si ions and atoms in the process chamber, and these Si-related substance in the process chamber are deposited on each side face to provide the Si-based compound deposition 62a. The etching gas includes Si-based compound (such as, $SiH_4$, $SiH_2Cl_2$, $SiHCl_3$, $SiCl_4$, $SiF_4$, and $Si_2H_6$). In this process, the etching mask 62 may contain no Si constitute element, and then the etching gas supplies Si atoms for the Si-based compound deposited material 62a.

In the both processes, the Si-based compound deposited material 62a is extremely thin, and has a thickness (a thickness measured in a direction normal to each side face), for example, 1 to 40 nm. The Si-based compound deposited material 62a is formed all over the side faces 41a, 41b, 42a, 42b, 43a, and 43b during the etching process. Specifically, the Si-based compound deposited material 62a covers almost all the side faces extending from the contact layer 14 to the first semiconductor layer 11 in the light receiving sections 3A to 3D, and covers almost all the side faces extending from the cladding layer 22 to the first semiconductor layer 11 in the optical waveguide section 5. But, the etching process updates a top surface subjected to the etching during the etching, thereby bring the upper surface of the first semiconductor layer 11 to completion, and this updating prevents Si-based compound material from depositing on the upper surface of the first semiconductor layer 11.

Figure 10:
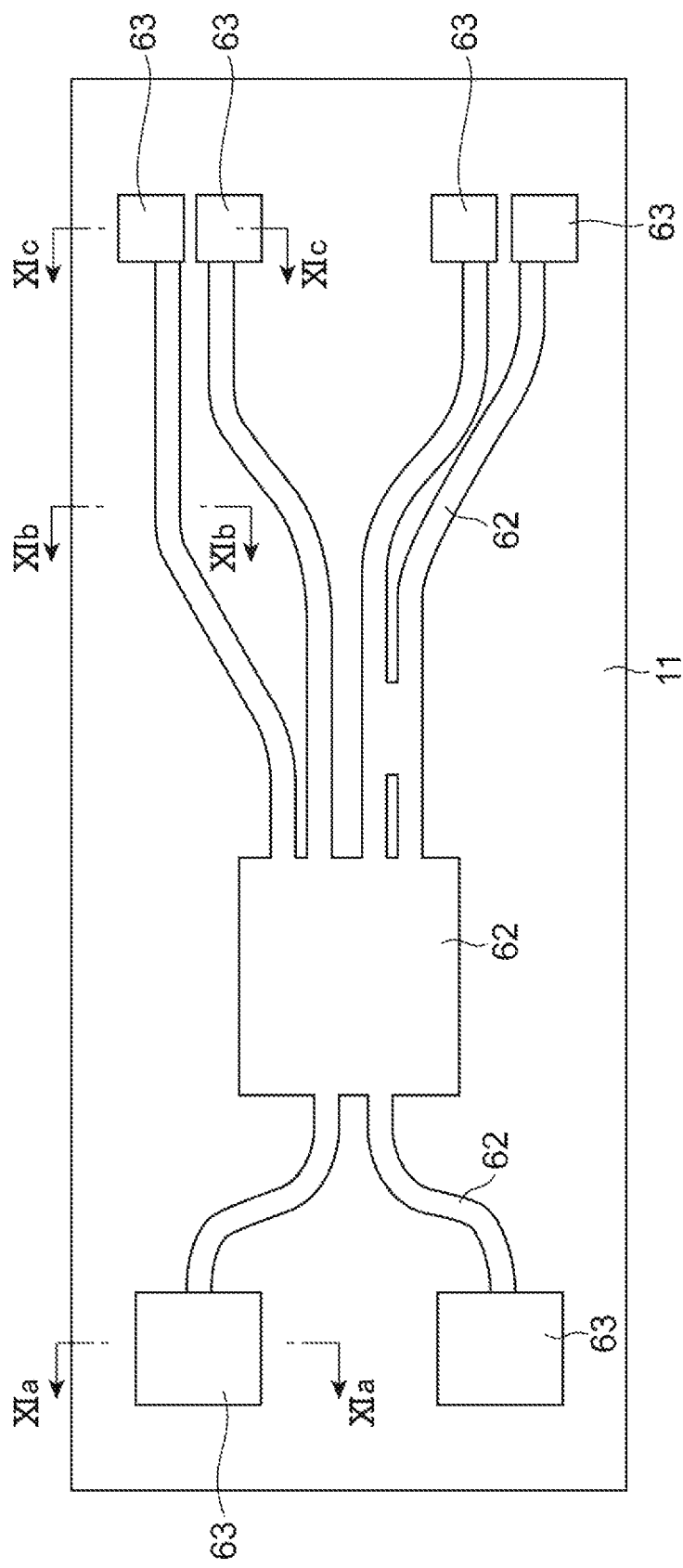
FIG. 10 is a plan view showing a major step in the method according to the embodiment.
Figure 11A:
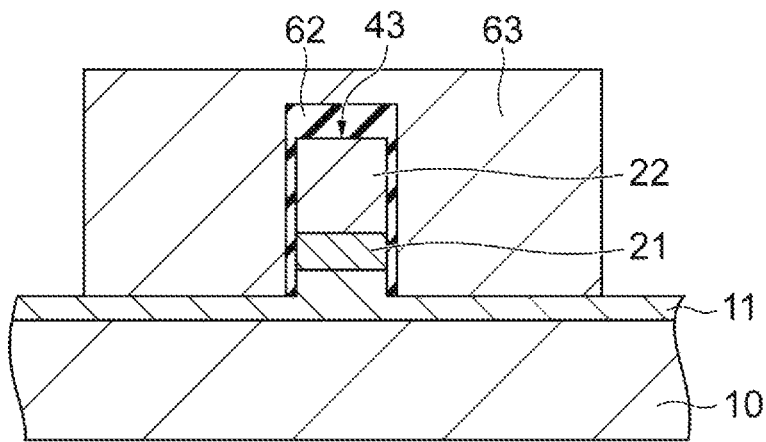
FIG. 11A is a cross-sectional view taken along line XIa-XIa shown in FIG. 10.
Figure 11B:
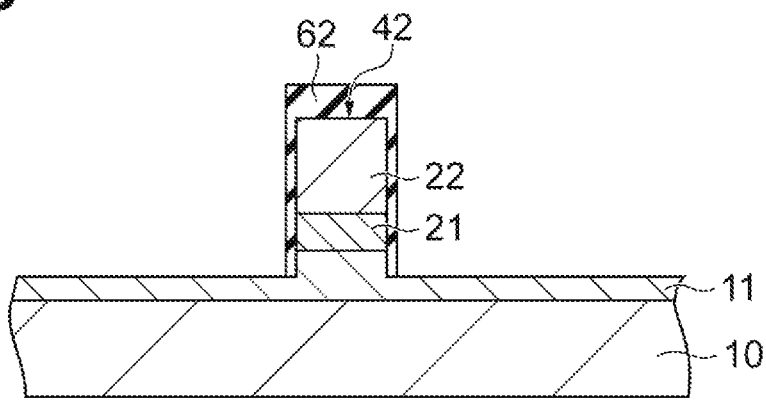
FIG. 11B is a cross-sectional view taken along line XIb-XIb shown in FIG. 10.
Figure 11C:
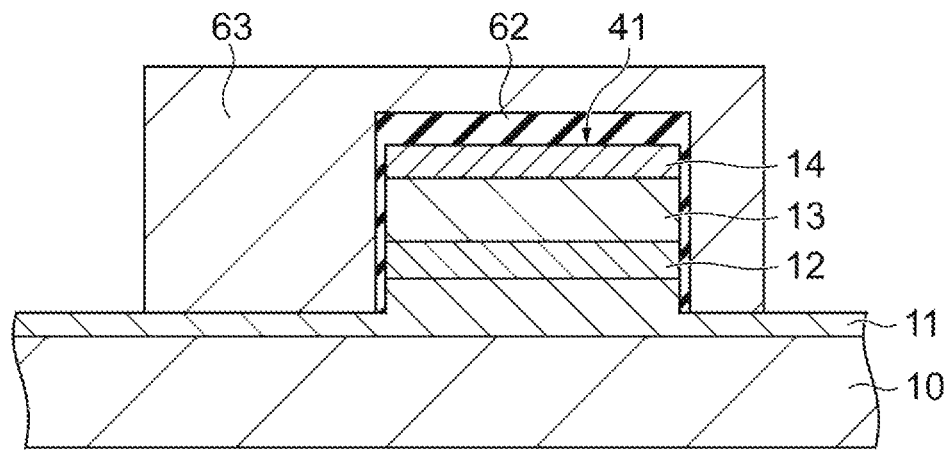
FIG. 11C is a cross-sectional view taken along line XIc-XIc shown in FIG. 10.

Subsequently, another etching mask 63 is formed (in the step for forming the second etching mask) in the present embodiment with the etching mask 62 remaining. FIG. 10 is a plan view, and FIGS. 11A, 11B and 11C are schematic cross sectional views taken along lines XIa-XIa, XIb-XIb, and XIc-XIc, respectively. The etching mask 63 is formed by photolithography and is prepared for the etching of the first semiconductor layer 11 to provide the light receiving sections 3A to 3D (shown in FIG. 1) with respective insulating regions. The etching mask 63 has a pattern which covers the mesa structure 41 and the etching mask 62, and an opening which is on the etching mask 62 and at least a part of the mesa structure 42. Specifically, the etching mask 63 covers the mesa structure 41 of the four light receiving sections 3A to 3D and covers the mesa structure 43 of the two spot size converters 53 and 54. From the viewpoint in pattern precision, the etching mask 63 has a width larger than that of the etching mask 62 in the direction intersecting the first direction A1. The mesa structure 42 for the optical waveguides 5a to 5h and the MMI couplers 51 and 52 is in the opening of the etching mask 63, but is covered with the etching mask 62. The etching mask 63 is made of a material allowing the selective removal of the etching mask 63 to the etching mask 62, such as a photosensitive material, for example, resist.

Figure 12A:
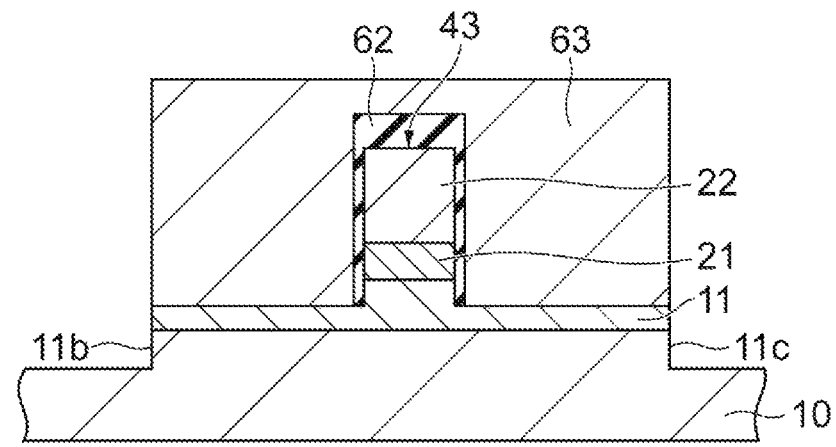
FIG. 12A is a cross-sectional view showing a major step in the method according to the embodiment.
Figure 12B:
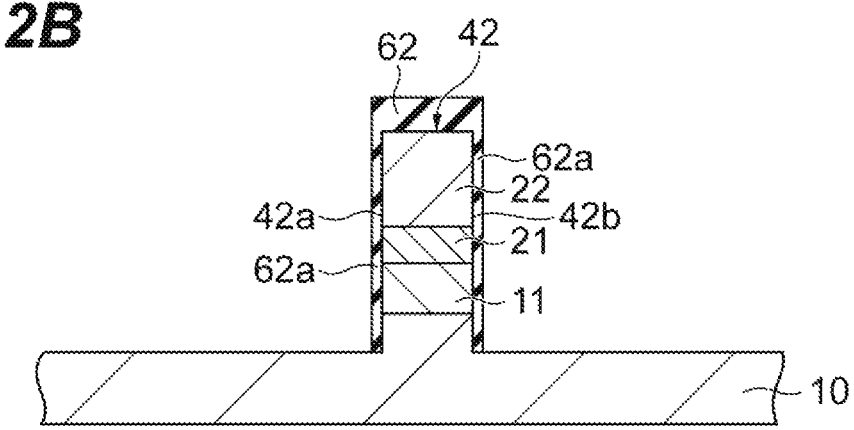
FIG. 12B is a cross-sectional view showing a major step in the method according to the embodiment.
Figure 12C:
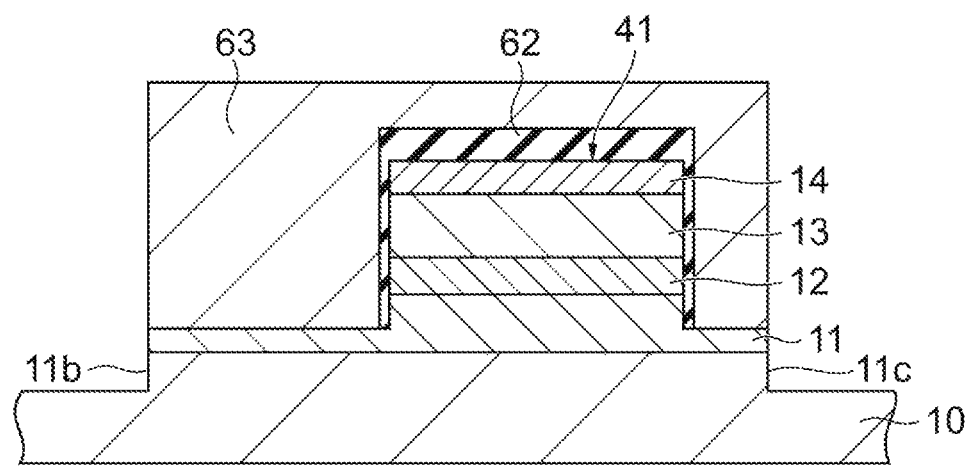
FIG. 12C is a cross-sectional view showing a major step in the method according to the embodiment.

Subsequently, the first semiconductor layer 11 is etched (in the second etching step) with the etching masks 62 and 63. FIGS. 12A, 12B and 12C are schematic cross sectional views showing the progress of the process shown in FIGS. 11A, 11B and 11C, respectively. This dry etching process, which exhibits anisotropic nature, etches the first semiconductor layer 11 and the substrate 10 with the etching masks 62 and 63 and an etching gas, such as halogen-based gas, in particular Si-containing halogen-based gas, which includes $SiCl_4$ and $SiF_4$. The dry etching is stopped in the substrate 10 to form an isolation semiconductor region, including a patterned first semiconductor layer 11, for each of the mesa structure 41 and the mesa structure 43. The isolation semiconductor region is provided with side faces 11b and 11c of the patterned first semiconductor layer 11 around the mesa structure 41 for each of the light receiving sections 3A to 3D and the mesa structure 43 for the spot size converters 53 and 54. Each of the mesa structures 41 and 43 is mounted on the isolation semiconductor region.

In particular, the etching produces a waveguide mesa structure from the preliminary mesa structure 42 and the first semiconductor layer 11 in the optical waveguide section 5, except for the spot size converters 53 and 54, and this waveguide mesa structure has a height larger than that of the preliminary mesa structure 42. Specifically, using the etching mask 62 and the etching mask 63 that is provided with the opening on the preliminary mesa structure 42 can pattern the first semiconductor layer 11 in the opening of the etching mask 63 using the preliminary mesa structure 42 as a mask, so that a part of the first semiconductor layer 11 that transversely adjoins the preliminary mesa structure 42 is removed to form a patterned first semiconductor layer 11, thereby forming the waveguide mesa structure (reference numeral 42 is used to denote the waveguide mesa structure). Protecting the preliminary mesa structure 42 with the etching mask 62 and the deposited material 62a in the opening of the etching mask 63 allows the etching to form a patterned first semiconductor layer 11 of a width that is substantially the same as that of the mesa structure 42, so that the patterned first semiconductor layer 11 has a side face, which is aligned with the side faces of the core layer 21 and the cladding layer 22, and the side faces of the patterned first semiconductor layer 11, the core layer 21, and the cladding layer 22 are arranged along a reference plane.

The etching process newly creates side faces in the first semiconductor layer 11 and substrate 10, and forms the Si compound deposited material 62a on the newly-created side faces as in the first etching step described above. The Si compound material 62a protects both the newly-created side faces and the side faces 42a and 42b. The etching process hardly changes the width, which is defined as an interval between the side faces 42a and 42b before or after the etching. In the optical waveguide section 5 that excludes the spot size converters 53 and 54, the Si compound material 62a is formed on the side ranging from the cladding layer 22 to the substrate 10.

Figure 13A:
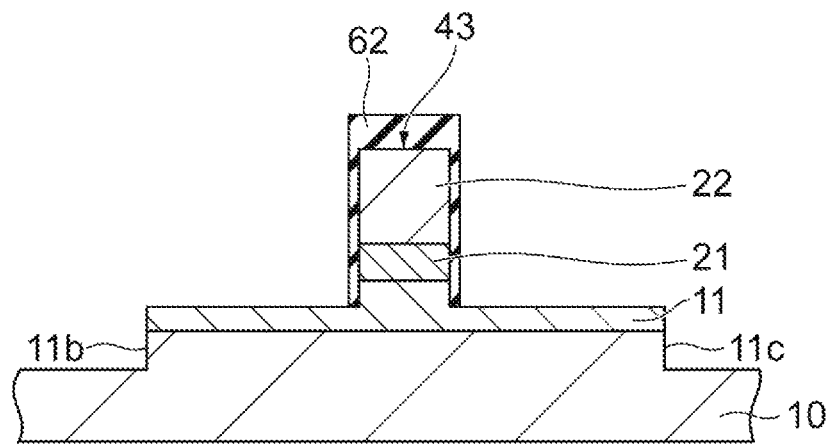
FIG. 13A is a cross-sectional view showing a major step in the method according to the embodiment.
Figure 13B:
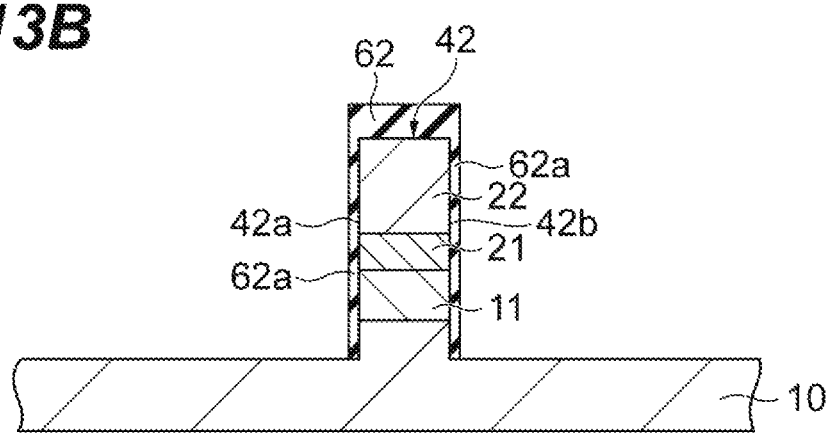
FIG. 13B is a cross-sectional view showing a major step in the method according to the embodiment.
Figure 13C:
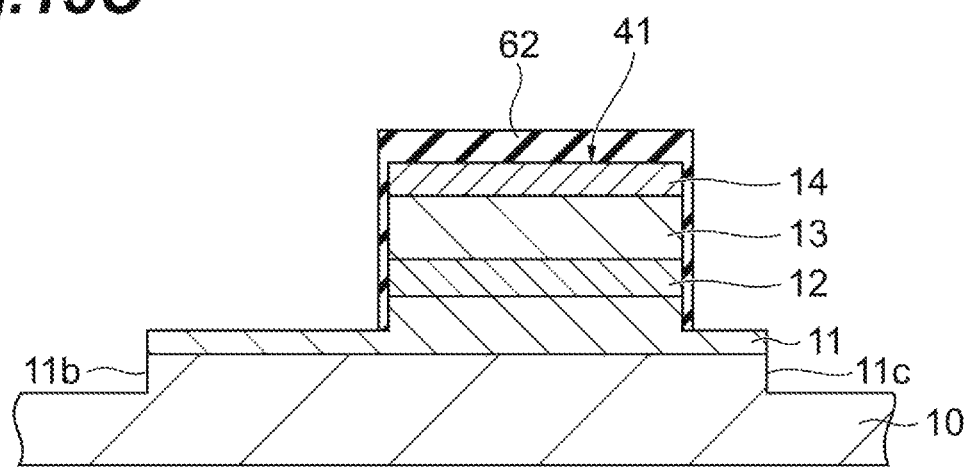
FIG. 13C is a cross-sectional view showing a major step in the method according to the embodiment.

Subsequently, the etching mask 63 is removed while leaving the etching mask 62. FIGS. 13A, 13B and 13C are cross sectional views showing the progress of the process shown in FIGS. 11A, 11B and 11C, respectively. Specifically, the etching mask 63 is removed off with an organic solvent and oxygen plasma for, for example, ashing. The Si compound deposited material 62a thus left prevents the side faces of the mesa structures 41 to 43 from being subjected to this removing process, thereby reducing the occurrence of damage to these side faces. After the removal of the etching mask 63, the etching mask 62 and the Si compound deposited material 62a are not removed to obtain a product.

Figure 14:
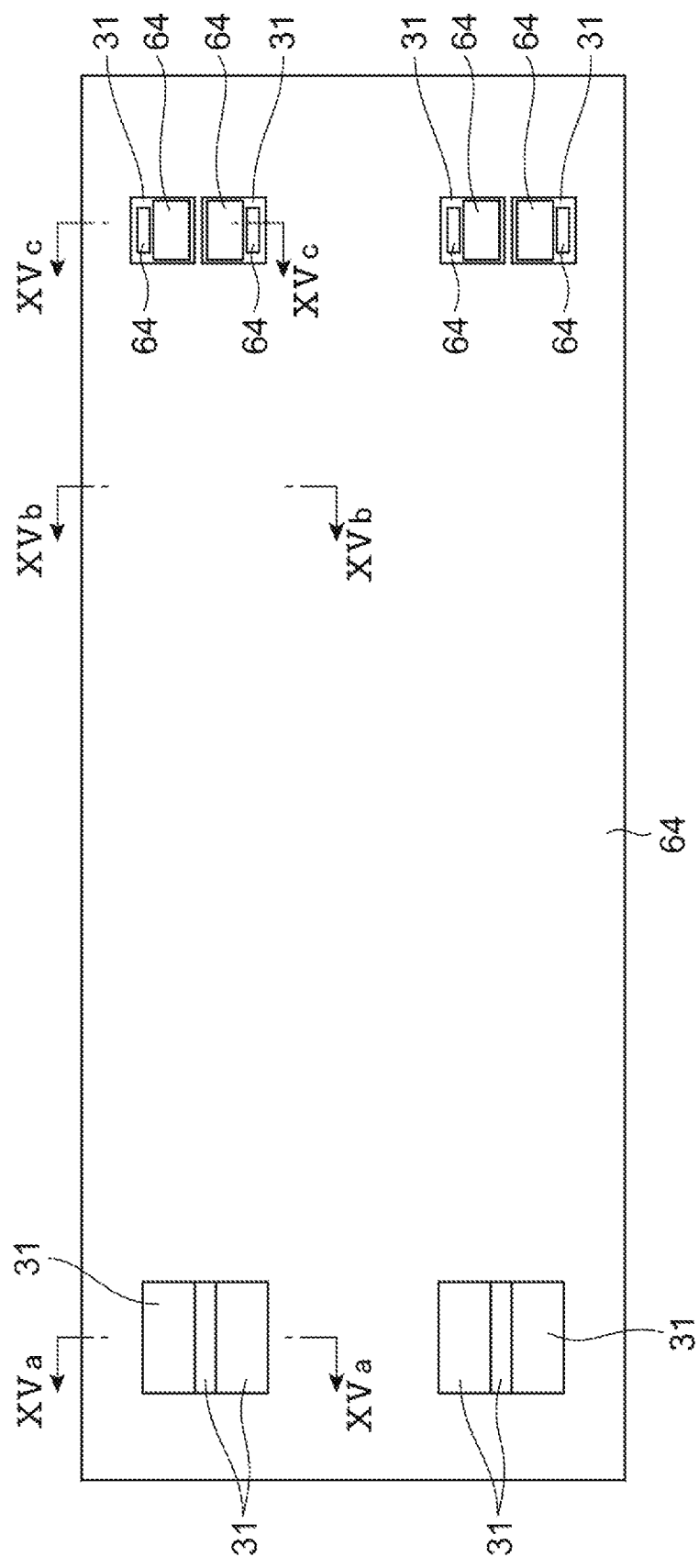
FIG. 14 is a plan view showing a major step in the method according to the embodiment.
Figure 15A:
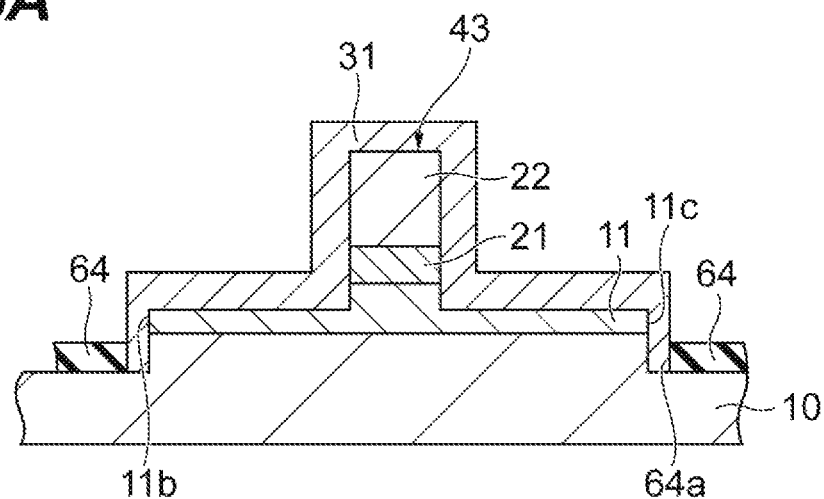
FIG. 15A is a cross-sectional view showing a major step in the method according to the embodiment.
Figure 15B:
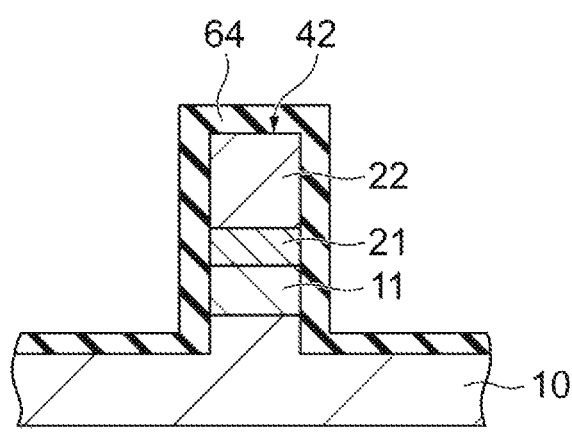
FIG. 15B is a cross-sectional view showing a major step in the method according to the embodiment.
Figure 15C:
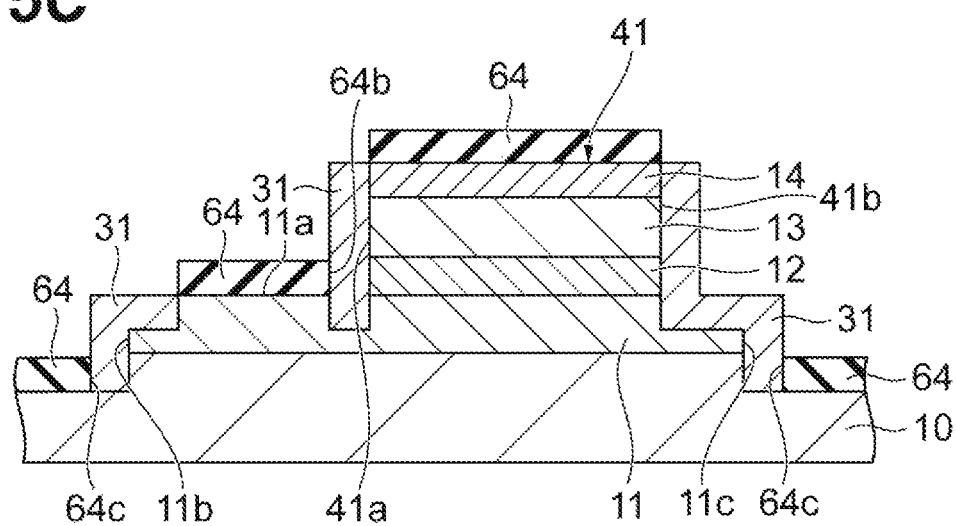
FIG. 15C is a cross-sectional view showing a major step in the method according to the embodiment.

Subsequently, a mask 64 is formed for selective growth on this product. FIG. 14 is a plan view, and FIGS. 15A, 15B and 15C are schematic cross sectional views taken along lines XVa-XVa, XVb-XVb, and XVc-XVc shown in FIG. 16. Specifically, a film for the mask (for example, SiN) is grown on the substrate 10. A resist mask is formed on the film, and the film is patterned by photolithography and wet etching with an etchant, such as BHF, to form the mask 64. This wet etching also removes the etching mask 62 and the Si compound deposited material 62a in the opening of the resist mask. The mask 64 for selective growth has an opening 64a, shown in FIG. 15A, on the mesa structure 43 and the side faces 11b and 11c of the patterned first semiconductor layer 11 for each of the two spot size converters 53 and 54, and the etching mask 62 and the Si compound deposited material 62a are removed in the opening 64a. The mask 64 has an opening 64b, shown in FIG. 15C, on the side faces 41a and 41b of the mesa structure 41 for each of the light receiving sections 3A to 3D, and the Si compound deposited material 62a is removed in the opening 64b. The mask 64 has an opening 64c on the side faces 11b and 11c of the first semiconductor layer 11 associated with the light receiving sections 3A to 3D, and the Si compound deposited material 62a on the side faces of the patterned first semiconductor layer 11 and substrate 10 are removed in the opening 64c. The mask 64 has a pattern which covers the optical waveguide section 5 and the light receiving sections 3A to 3D, specifically, the top of the mesa structure 41 and the region 11a of the patterned first semiconductor layer 11 for use in the electrical contacts.

Figure 16:
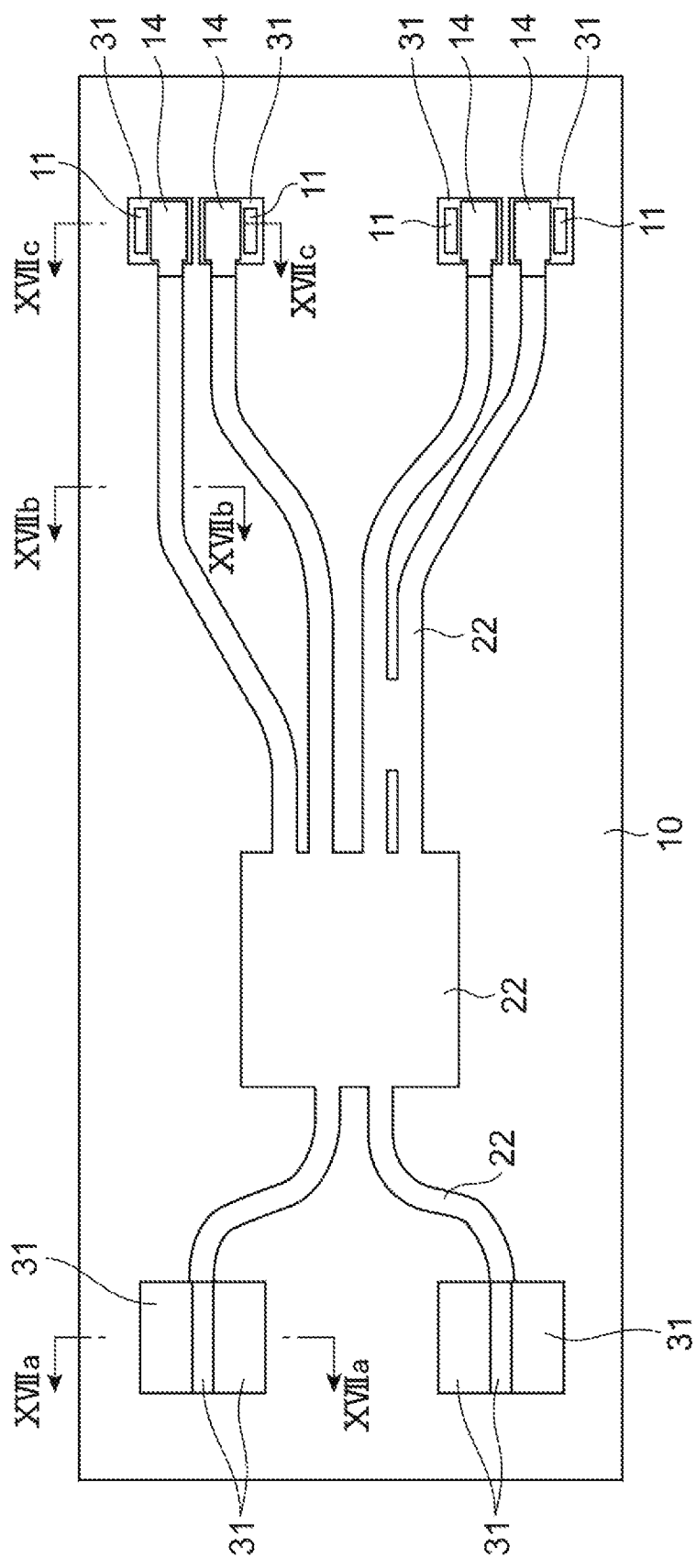
FIG. 16 is a plan view showing a major step in the method according to the embodiment.
Figure 17A:
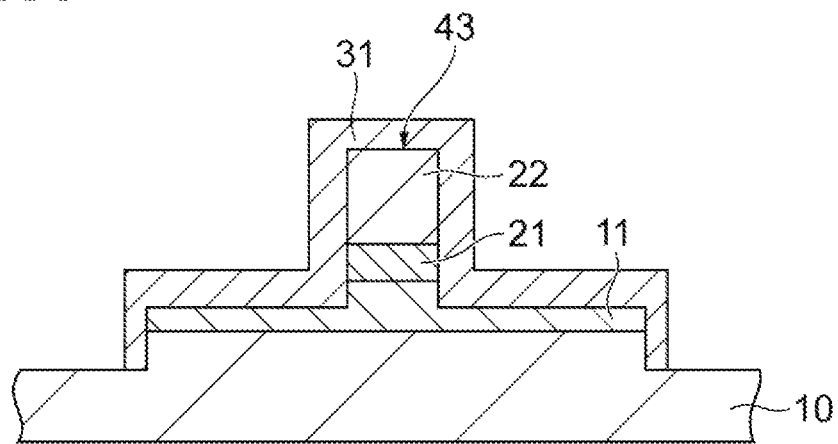
FIG. 17A is a cross-sectional view taken along line XVIIa-XVIIa shown in FIG. 16.
Figure 17B:
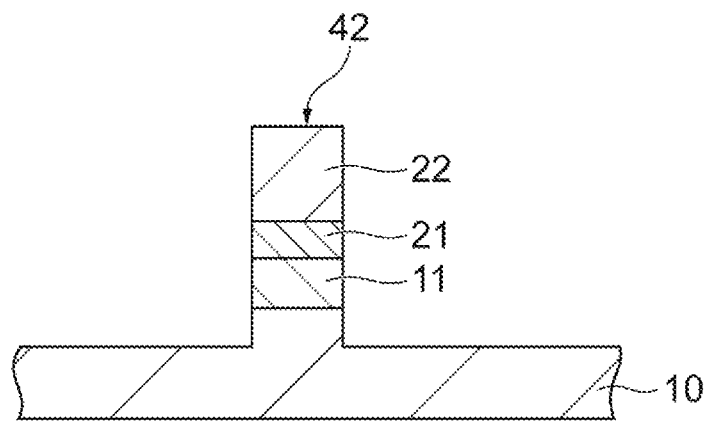
FIG. 17B is a cross-sectional view taken along line XVIIb-XVIIb shown in FIG. 16.
Figure 17C:
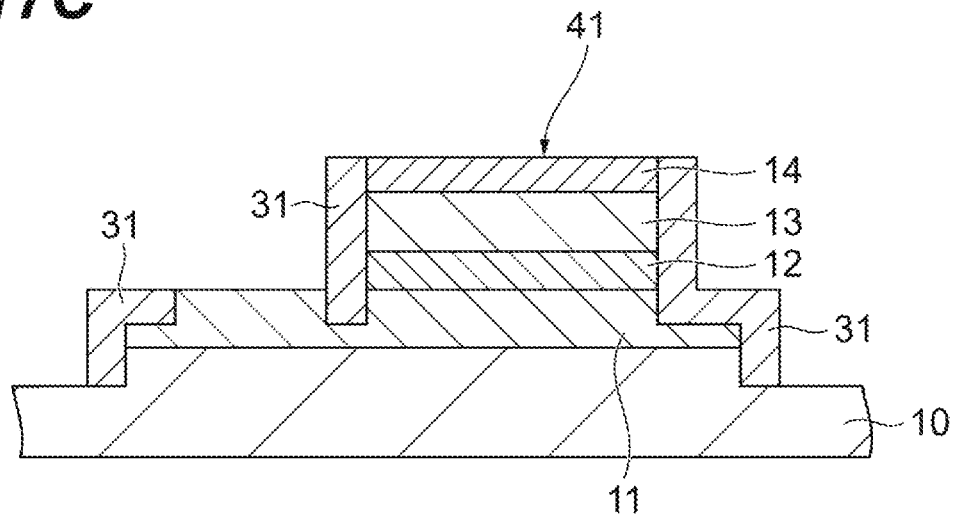
FIG. 17C is a cross-sectional view taken along line XVIIc-XVIIc shown in FIG. 16.

Subsequently, before the selective growth, the damaged layer, which the dry etching process may form on the semiconductor surface, is removed by wet etching using, for example, an HCl based etchant. Thereafter, a semi-insulating semiconductor layer for the semi-insulating semiconductor layer 31 is regrown by, for example, OMVPE with the mask 64 on the semiconductor region that is in the openings 64a, 64b, and 64c of the selective growth mask 64 on the wafer. FIG. 16 is a plan view, and FIGS. 17A, 17B and 17C are cross sectional views taken along lines XVIIa-XVIIa, XVIIb-XVIIb, and XVIIc-XVIIc, respectively. As shown in these drawings, the mask 64 is removed by wet etching using, for example, BHF, to form a semi-insulating semiconductor layer 31 with contact holes. This wet etching also removes the etching mask 62 and the Si compound deposited material 62a on the wafer.

Subsequently, after removing the mask 64, a first electrode and a second electrode, which are labeled as the first and second electrodes 33 and 32 in FIGS. 1 and 2C, are formed in the openings of the semi-insulating semiconductor layer 31. Specifically, a film (for example, an SiN film) is grown on the entire surface of the substrate 10; the film is patterned by photolithography and etching, such as RIE, using an etching gas of, for example, $CF_4$ to form a protective film having contact holes, which are aligned with the openings of the semi-insulating semiconductor layer 31. A metal laminate is formed in the contact holes to form the first and second electrodes 33 and 32. These processes bring the waveguide-type light receiving device 1A of the present embodiment to completion.

The method for making the waveguide-type light receiving device 1A according to the embodiment described above has advantageous effects. In the present embodiment, the etching mask 62 is used to form the mesa structures 41 to 43 by dry etching; then the etching mask 63 is formed on the mesa structures 41 to 43 and the etching mask 62; and the first semiconductor layer 11 is removed by dry etching with both the etching masks 62 and 63, so that the waveguide mesa is produced from the preliminary mesa structure 42 and has side faces, having a bottom in the substrate 10, in addition to the side faces 42a and 42b. The dry etching with the etching masks 62 and 63 allows the patterned first semiconductor layer 11 to have substantially the same width as that of the mesa structure 42, and the height of the optical waveguide mesa thus produced is larger than heights of the mesa structure 41 and the preliminary mesa structure 42. The waveguide mesa is provided with the patterned first semiconductor layer 11 having a narrow width to allow the waveguide mesa, which is connected to the light receiving sections 3A to 3D, to have a high electric resistance. The optical waveguide section 5 with the narrow first semiconductor layer 11 makes the isolation resistance among the light receiving sections 3A to 3D increased, and also makes the crosstalk in the light receiving sections 3A to 3D reduced.

Forming a second mask, associated with the etching mask 63, after removing a first mask, associated with the etching mask 62, needs twice mask alignments and requires the second mask to have a width larger than that of the first mask because of misalignment of the second mask. This larger width of the second mask makes the resultant waveguide mesa wider, thereby preventing the waveguide from having a large electric resistance. The present embodiment allows the width of the patterned first semiconductor layer 11 in the optical waveguide section 5 to be the substantially the same as that of the preliminary mesa structure 42, thereby enhancing the isolating resistance.

In the present embodiment, using the etching mask 62 made of a material containing Si as a constituent element in the etching can form the Si compound deposited material 62a on each side face of the mesa structures 41 to 43 during the first etching step. In the second etching step, the Si compound deposited material 62a may be further formed on the side faces of the patterned first semiconductor layer 11 in addition to the side faces 42a and 42b of the mesa structure 42 during the dry etching. Alternatively, in the first etching step that uses a Si-containing etching gas, using the Si-containing etching gas in the etching can form the Si compound material 62a on the side faces of the patterned first semiconductor layer 11 in addition to the side faces 42a and 42b of the mesa structure 42 during the dry etching. In the above two processes, the Si compound deposited material 62a formed in the first etching step can protect the side faces 42a and 42b of the mesa structure 42 from the etching gas in the second etching step, whereby the width of the mesa structure 42 can be maintained. Selectively removing the etching mask 63 without removing the etching mask 62 can protect the side faces of the waveguide mesa structure 42 to reduce damage, thereby suppressing an increase in optical loss.

In the embodiment, the etching mask 63 may contain a photosensitive material, which can make selectively removal of the etching mask 63 easily while leaving the etching mask 62.

The light receiving device 1A according to the present embodiment provides the waveguide mesa structure 42, which is produced from the preliminary mesa structure with the side faces 42a and 42b, reaching the substrate 10 and provides the lowermost first semiconductor layer 11 with the width that is substantially the same as that of the preliminary mesa structure 42. The lowermost first semiconductor layer 11 contained in the waveguide mesa structure 42 has a cross section perpendicular to the direction along which the optical waveguide extends, and the cross sectional area becomes small. The small cross sectional area increases the electric resistance of the patterned first semiconductor layer 11. This results in that the patterned first semiconductor layer 11 in the optical waveguide section 5 can increase the electrical isolation between the adjacent devices among the light receiving sections 3A to 3D and can reduce the crosstalk among the light receiving sections 3A to 3D.

The light receiving device according to the present embodiment and the method for fabricating the same are not limited to the above specific structures, and various other modifications are possible. The light receiving device is provided with the substrate, the first semiconductor layer, the light absorbing layer, the second semiconductor layer, the core layer, and the cladding layer, which are made of InP-based semiconductors, but is provided with other III-V group compound semiconductors or semiconductors different from III-V group compound semiconductors. In the above embodiment, the light receiving device is used for the coherent light receiver, but may be used for other applications.

The light receiving device and the method for fabricating the same according to the embodiment enhance the isolation resistance between the adjacent light receiving sections.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A method for fabricating a light receiving device comprising: an optical waveguide section including a waveguide mesa structure, a first photodiode structure optically coupled to the waveguide mesa structure; a second photodiode structure optically coupled to the waveguide mesa structure; and a semiconductor base including an isolation region having one of insulating and semi-insulating properties, the waveguide mesa structure, the first photodiode structure, and the second photodiode structure being disposed on the base, wherein each of the first photodiode structure and the second photodiode structure includes a photodiode mesa structure and an isolation mesa structure, the isolation mesa structure mounting the photodiode mesa structure, the waveguide mesa structure has a bottom in the isolation region, and the photodiode mesa structure has a bottom apart from the isolation region, said method comprising:

preparing a first substrate product including the semiconductor base and a semiconductor region on the semiconductor base, the semiconductor region having a common semiconductor layer, a first semiconductor laminate for the photodiode structures, a second semiconductor laminate for the optical waveguide section, and a butt-joint between the first semiconductor laminate and the second semiconductor laminate, and the first semiconductor laminate and the second semiconductor laminate being disposed on the common semiconductor layer;

forming a first mask on the first substrate product, the first mask having a pattern on the first semiconductor laminate and the second semiconductor laminate, and the pattern of the first mask extending across the butt-joint;

etching the first substrate product with the first mask and an etching gas to form a second substrate product, the second substrate product having the photodiode mesa structure produced from the first semiconductor laminate and a preliminary mesa structure produced from the second semiconductor laminate;

forming a second mask on the second substrate product, the second mask having a pattern on the photodiode mesa structure and an opening on the preliminary mesa structure; and etching the second substrate product with the first mask and the second mask to produce the isolation mesa structure upon which the photodiode mesa structure is mounted in the isolation region, and the waveguide mesa structure from the preliminary mesa structure, the waveguide mesa structure having a height larger than that of the preliminary mesa structure.

2. The method according to claim 1, wherein the first mask includes a material containing silicon, the etching of the first substrate product with the first mask and an etching gas includes depositing Si-based material on side faces of the photodiode mesa structure and the preliminary mesa structure, and etching the second substrate product with the first mask and the second mask includes depositing Si-based material on side faces of the waveguide mesa structure.

3. The method according to claim 1, wherein the etching gas includes Si-based material, the etching of the first substrate product with the first mask and an etching gas includes depositing Si-based material on side faces of the photodiode mesa structure and the preliminary mesa structure, and etching the second substrate product with the first mask and the second mask includes depositing Si-based material on side faces of the waveguide mesa structure.

4. The method according to claim 3, wherein the first mask includes inorganic material and the second mask includes photosensitive material.

* * * * *